United States Patent
Han et al.

(10) Patent No.: US 9,905,550 B2
(45) Date of Patent: Feb. 27, 2018

(54) SEMICONDUCTOR PACKAGE AND METHOD OF FABRICATING THE SAME

(71) Applicants: Sang-Uk Han, Hwaseong-si (KR); Seungwon Park, Seoul (KR); Un-Byoung Kang, Hwaseong-si (KR); Taeje Cho, Yongin-si (KR)

(72) Inventors: Sang-Uk Han, Hwaseong-si (KR); Seungwon Park, Seoul (KR); Un-Byoung Kang, Hwaseong-si (KR); Taeje Cho, Yongin-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 269 days.

(21) Appl. No.: 14/736,247

(22) Filed: Jun. 10, 2015

(65) Prior Publication Data

US 2016/0013174 A1     Jan. 14, 2016

(30) Foreign Application Priority Data

Jul. 11, 2014   (KR) .................. 10-2014-0087676

(51) Int. Cl.
     *H01L 21/00*      (2006.01)
     *H01L 25/00*      (2006.01)
     (Continued)

(52) U.S. Cl.
     CPC ............ *H01L 25/50* (2013.01); *H01L 21/561* (2013.01); *H01L 21/82* (2013.01); *H01L 21/568* (2013.01);
(Continued)

(58) Field of Classification Search
CPC ... H01L 25/0657; H01L 25/50; H01L 21/561; H01L 21/82; H01L 23/3121;
(Continued)

(56) References Cited

U.S. PATENT DOCUMENTS

| 5,408,739 A | 4/1995 | Altavela et al. |
| 5,506,610 A | 4/1996 | Altavela et al. |

(Continued)

FOREIGN PATENT DOCUMENTS

| JP | 2012146853 A | 8/2012 |
| JP | 2012209449 A | 10/2012 |
| KR | 20120091867 A | 8/2012 |

*Primary Examiner* — Thanh Y Tran
(74) *Attorney, Agent, or Firm* — Renaissance IP Law Group LLP

(57) ABSTRACT

Embodiments of the inventive concepts provide a semiconductor package and a method of fabricating the same. The method includes forming a groove to separate first semiconductor chips from each other. Forming the groove include performing a first sawing process on a bottom surface of a semiconductor substrate to cut the semiconductor substrate and a portion of a mold layer in a direction inclined with respect to the bottom surface, and performing a second sawing process to cut the mold layer in a direction substantially perpendicular to the bottom surface of the semiconductor substrate. A minimum width of the groove formed in the semiconductor substrate by the first sawing process may be greater than a width of the groove formed in the mold layer by the second sawing process.

20 Claims, 22 Drawing Sheets

(51) Int. Cl.
*H01L 21/82* (2006.01)
*H01L 21/56* (2006.01)
*H01L 23/31* (2006.01)

(52) U.S. Cl.
CPC ............ *H01L 23/3128* (2013.01); *H01L 2224/16145* (2013.01); *H01L 2224/32145* (2013.01); *H01L 2224/73204* (2013.01); *H01L 2224/97* (2013.01); *H01L 2924/15311* (2013.01)

(58) Field of Classification Search
CPC . H01L 23/315; H01L 23/3128; H01L 21/568; H01L 2224/16145; H01L 2924/15311; H01L 2224/97; H01L 2224/32145; H01L 2224/73204
See application file for complete search history.

(56) References Cited

U.S. PATENT DOCUMENTS

| | | | |
|---|---|---|---|
| 6,291,316 B1 | 9/2001 | Knowles et al. | |
| 6,482,730 B1 | 11/2002 | Masumoto et al. | |
| 6,915,795 B2 | 7/2005 | Brouillette et al. | |
| 6,955,944 B2 | 10/2005 | Horie | |
| 7,244,664 B2 | 7/2007 | Blair et al. | |
| 7,413,925 B2 | 8/2008 | Egawa | |
| 7,556,985 B2 | 7/2009 | Fukasawa et al. | |
| 7,795,073 B2 | 9/2010 | Han et al. | |
| 7,906,437 B2 | 3/2011 | Keenan et al. | |
| 8,298,963 B2 | 10/2012 | Akiba et al. | |
| 8,426,252 B2 | 4/2013 | Chung et al. | |
| 8,455,301 B2 | 6/2013 | Lee et al. | |
| 8,637,969 B2* | 1/2014 | Lee | H01L 21/561 257/686 |
| 8,759,963 B2* | 6/2014 | Nah | H01L 21/50 257/686 |
| 2003/0211707 A1 | 11/2003 | Brouillette et al. | |
| 2004/0048415 A1 | 3/2004 | Horie | |
| 2005/0095816 A1 | 5/2005 | Blair et al. | |
| 2006/0030127 A1 | 2/2006 | Fukasawa et al. | |
| 2007/0045229 A1 | 3/2007 | Keenan et al. | |
| 2007/0184583 A1 | 8/2007 | Egawa | |
| 2009/0197372 A1 | 8/2009 | Han et al. | |
| 2010/0181681 A1 | 7/2010 | Akiba et al. | |
| 2010/0258933 A1* | 10/2010 | Fujishima | H01L 21/566 257/686 |
| 2011/0006408 A1* | 1/2011 | Liao | H01L 21/561 257/660 |
| 2011/0074017 A1 | 3/2011 | Morifuji et al. | |
| 2012/0077314 A1* | 3/2012 | Park | H01L 25/0657 438/109 |
| 2012/0088332 A1 | 4/2012 | Lee et al. | |
| 2012/0261821 A1 | 10/2012 | Chung et al. | |
| 2013/0095586 A1 | 4/2013 | Kim et al. | |

* cited by examiner

SEMICONDUCTOR PACKAGE AND METHOD OF FABRICATING THE SAME

CROSS-REFERENCE TO RELATED APPLICATION

This U.S. non-provisional patent application claims priority under 35 U.S.C. § 119 to Korean Patent Application No. 10-2014-0087676, filed on Jul. 11, 2014, in the Korean Intellectual Property Office, the disclosure of which is hereby incorporated by reference in its entirety.

BACKGROUND

The inventive concepts relate to a semiconductor and, more particularly, to a multichip semiconductor package having a through-via and a method of fabricating the same.

Light, small, high-speed and high-performance electronic products may be provided at low prices with the development of an electronic industry. Integrated circuit chips may be housed in semiconductor packages so as to be used in the electronic products. Various researches have been conducted to improve performance of the semiconductor packages. In particular, as high-performance semiconductor packages have been demanded, a through-silicon-via (TSV) technique has been developed instead of a conventional wire bonding technique for a semiconductor package.

SUMMARY

Embodiments of the inventive concepts are directed to a reliable semiconductor package having a plurality of stacked semiconductor chips and a method of fabricating the same.

In one aspect, a method of fabricating a semiconductor package may include: providing a semiconductor substrate having a top surface on which chip stacks are mounted, each of the chip stacks comprising a plurality of stacked semiconductor chips; forming a mold layer covering the chip stacks on the top surface of the semiconductor substrate; and forming a groove penetrating the semiconductor substrate and the mold layer by performing a sawing process on a bottom surface of the semiconductor substrate. The groove may include: first sidewalls adjacent to the top surface of the semiconductor substrate and extending in a direction inclined with respect to the bottom surface of the semiconductor substrate; second sidewalls connected to the first sidewalls and extending in a direction substantially perpendicular to the bottom surface of the semiconductor substrate; and edges formed at a location where the first sidewalls meet the second sidewalls. The edges may be formed in the mold layer.

In some embodiments, a maximum width of the groove formed in the semiconductor substrate may be greater than a maximum width of the groove formed in the mold layer.

In some embodiments, forming the groove may include: sawing the semiconductor substrate from the bottom surface of the semiconductor substrate toward the mold layer to form a first groove having the first sidewalls, the mold layer being exposed along the first sidewalls of the first groove; and sawing the mold layer exposed by the first groove to form a second groove having the second sidewalls.

In some embodiments, the first sidewall may make an obtuse angle with the bottom surface of the semiconductor substrate.

In some embodiments, the semiconductor substrate may include base semiconductor chips having through-vias penetrating the base semiconductor chips, and the chip stacks may be electrically connected to the base semiconductor chips, respectively.

In some embodiments, the semiconductor substrate may be divided into the base semiconductor chips by the groove and the mold layer may be divided into unit mold layers by the groove. A minimum distance between the base semiconductor chips adjacent to each other may be greater than a minimum distance between the unit mold layers respectively disposed on the base semiconductor chips adjacent to each other.

In some embodiments, active surfaces of the semiconductor chips of the chip stacks may face the semiconductor substrate.

In some embodiments, the groove may penetrate the mold layer disposed between a pair of adjacent chip stacks.

In some embodiments, the semiconductor substrate may include: a silicon nitride layer covering the bottom surface; and external terminals such as solder balls formed on the bottom surface. The silicon nitride layer may be exposed.

In another aspect, a method of fabricating a semiconductor package may include: preparing a semiconductor substrate including first semiconductor chips; mounting second semiconductor chips on a top surface of the semiconductor substrate; forming a mold layer covering the second semiconductor chips on the top surface of the semiconductor substrate; and forming a groove penetrating the semiconductor substrate and the mold layer to separate the first semiconductor chips from each other. Forming the groove may include: performing a first sawing process on a bottom surface of the semiconductor substrate to cut the semiconductor substrate and a portion of the mold layer in a direction inclined with respect to the bottom surface of the semiconductor substrate; and performing a second sawing process to cut the mold layer in a direction substantially perpendicular to the bottom surface of the semiconductor substrate. A minimum width of the groove formed in the semiconductor substrate by the first sawing process may be greater than a width of the groove formed in the mold layer by the second sawing process.

In some embodiments, the second sawing process may be performed to be spaced apart from the semiconductor substrate.

In some embodiments, the groove formed by the first sawing process may have inclined sidewalls, and the semiconductor substrate and the mold layer may be exposed along the inclined sidewalls.

In some embodiments, the first semiconductor chip may include: a first integrated circuit layer; a passivation layer covering the first integrated circuit layer; a first through-via penetrating the first semiconductor chip and connected to the first integrated circuit layer; and an external terminal such as a solder ball electrically connected to the first integrated circuit layer. The passivation layer (e.g., silicon nitride layer) may be exposed.

In some embodiments, the method may further include: mounting third semiconductor chips on the second semiconductor chips. Each of the second semiconductor chips may have a through-via penetrating each of the second semiconductor chips.

In some embodiments, the semiconductor substrate may be divided into the first semiconductor chips by the first sawing process, and the mold layer may be divided into unit mold layers by the second sawing process. A minimum distance between the first semiconductor chips adjacent to each other may be greater than a minimum distance between the unit mold layers respectively disposed on the first semiconductor chips adjacent to each other.

In still another aspect, a semiconductor package may include: a first semiconductor chip having a bottom surface, a top surface opposite to the bottom surface, and a sidewall; a second semiconductor chip mounted on the top surface of the first semiconductor chip; and a molding layer provided on the top surface of the first semiconductor chip and covering sidewalls of the second semiconductor chip. The sidewall of the first semiconductor chip may make an obtuse angle with the bottom surface of the first semiconductor chip. The mold layer may include: an inclined sidewall substantially coplanar with the sidewall of the first semiconductor chip; a vertical sidewall provided on the inclined sidewall and extending in a direction perpendicular to the bottom surface of the first semiconductor chip; and an edge may be formed at a location where the inclined sidewall meets the vertical sidewall.

In some embodiments, a maximum width of the mold layer may be greater than a maximum width of the first semiconductor chip.

In some embodiments, the first semiconductor chip may have a first through-via penetrating the first semiconductor chip, and the bottom surface of the first semiconductor chip may be an active surface. An active surface of the second semiconductor chip may face the first semiconductor chip.

In some embodiments, a width of the first semiconductor chip may become progressively greater from the bottom surface toward the top surface of the first semiconductor chip.

In some embodiments, the semiconductor package may further include: a third semiconductor chip mounted on the second semiconductor chip. The second semiconductor chip may have a through-via penetrating the second semiconductor chip.

In some embodiments, a thickness of the third semiconductor chip may be different from that of the second semiconductor chip.

In some embodiments, the first semiconductor chip may include: a passivation layer (e.g., a silicon nitride layer) disposed on the bottom surface thereof; and an external terminal (e.g. a solder ball) electrically connected to the through-via. The passivation layer may be exposed.

In some embodiments, the bottom surface of the first semiconductor chip may not be covered with a polymer layer, and the sidewall of the first semiconductor chip may not be covered with the mold layer.

In some embodiments, the semiconductor package may further include a bump disposed between the first and second semiconductor chips. The second semiconductor chip may be electrically connected to the first semiconductor chip through the bump.

In some embodiments, a top surface of the third semiconductor chip is exposed through the mold layer.

In some embodiments, a method of fabricating a semiconductor package, the method comprising: providing a semiconductor substrate having a top surface on which chip stacks are mounted, each of the chip stacks comprising a plurality of stacked semiconductor chips; forming a mold layer covering the chip stacks on the top surface of the semiconductor substrate; and forming a first groove penetrating the semiconductor substrate, the first groove having first sidewalls inclined with respect to a bottom surface of the semiconductor substrate; and forming a second groove penetrating the mold layer extending in a direction substantially perpendicular to the bottom surface of the semiconductor substrate to form package units separated from each other, wherein the second groove comprise second sidewalls connected to the first sidewalls, the second groove exposed through the first groove.

In some embodiments, edges are formed at a location where the first sidewalls meet the second sidewalls, and wherein the edges are formed in the mold layer.

In some embodiments, edges are formed at a location where the first sidewalls meet the second sidewalls, and wherein the edges are formed on sidewalls of the semiconductor chips.

In some embodiments, forming the first groove comprises performing a sawing process using a blade having a V-shaped cross-section on the bottom surface of the semiconductor substrate toward the mold layer to form the first groove, wherein forming the second groove comprises performing another sawing process on the mold layer exposed through the first groove using a second blade having a substantially rectangular cross-section.

In some embodiments, a width of the second groove formed in the mold layer is smaller than a width of the first groove at the bottom surface of the semiconductor substrate, and wherein the width of the second groove formed in the mold layer is substantially equal to a width of the first groove at the top surface of the semiconductor substrate.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1A:
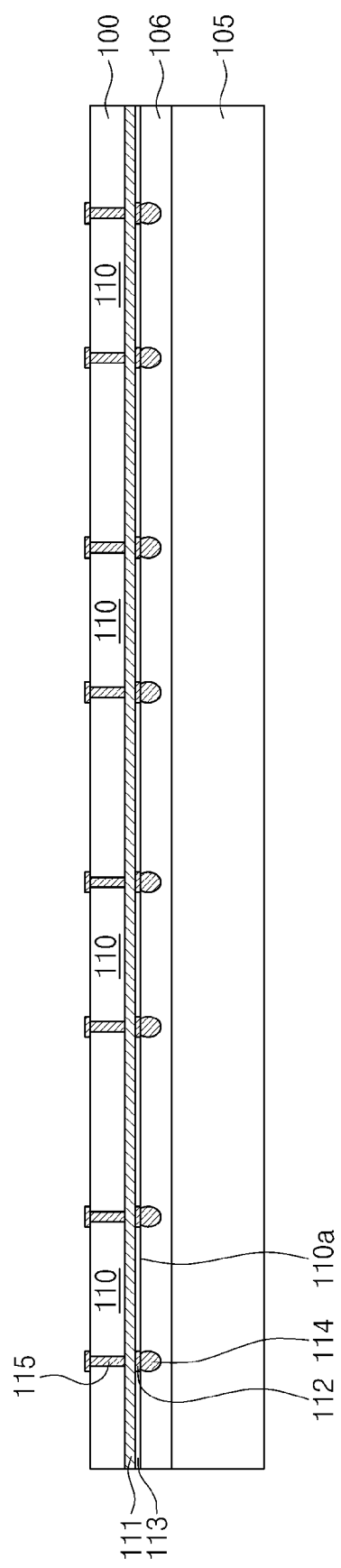
FIGS. 1A to 1F are cross-sectional views illustrating a method of fabricating a semiconductor package according to some embodiments of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as being limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the inventive concepts. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result of, for example, manufacturing techniques and/or tolerances, are to be expected. Thus, exemplary embodiments should not be construed as being limited to the shapes of regions illustrated herein but are to include deviations in shapes that result from, for example, manufacturing. For instance, an etching region illustrated as a rectangle may have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, where a plurality of devices according to various embodiments described herein are integrated in the same microelectronic device. Accordingly, the cross-sectional view(s) illustrated herein may be replicated in two different directions, which need not be orthogonal, in the microelectronic device. Thus, the plan view of the microelectronic device that embodies devices according to various embodiments described herein may include a plurality of devices in an array and/or in a two-dimensional pattern based on the functionality of the microelectronic device.

The devices formed according to various embodiments described herein may be interspersed among other devices depending on the functionality of the microelectronic device. Moreover, microelectronic devices formed according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Methods of fabricating a semiconductor package according to embodiments of the inventive concepts will be described hereinafter.

FIGS. 1A to 1F are cross-sectional views illustrating a method of fabricating a semiconductor package according to some embodiments of the inventive concepts.

Referring to FIG. 1A, a first semiconductor chip 110 may be disposed on a carrier substrate 105. For example, a semiconductor substrate 100 including one or more first semiconductor chips 110 may be bonded to a top surface of the carrier substrate 105 by a carrier adhesive layer 106 interposed therebetween. The semiconductor substrate 100 may be a wafer-level semiconductor substrate that is formed of a semiconductor such as silicon. The first semiconductor chip 110 may include a first integrated circuit layer 111 and a first through-via 115. The first integrated circuit layer 111 may be adjacent to a bottom surface 110a of the first semiconductor chip 110. The first integrated circuit layer 111 may include a memory circuit, a logic circuit, or a combination thereof. The first through-via 115 may penetrate the first semiconductor chip 110 and may be electrically connected to the first integrated circuit layer 111. A passivation layer such as a silicon nitride layer 113 may cover the first integrated circuit layer 111. External terminals such as external solder balls 114 may be provided on the bottom surface 110a of the first semiconductor chip 110 and may be electrically connected to the first integrated circuit layer 111 through pads 112. The bottom surface 110a of the first semiconductor chip 110 may comprise an active surface. The silicon nitride layer 113 may not cover the external solder balls 114. According to some embodiments of the inventive concepts, a polymer layer (not shown) such as a photosensitive polyimide layer may not be formed on the silicon nitride layer 113. Thus, the silicon nitride layer 113 may be exposed at the bottom surface 110a of the first semiconductor chip 110.

Figure 1B:
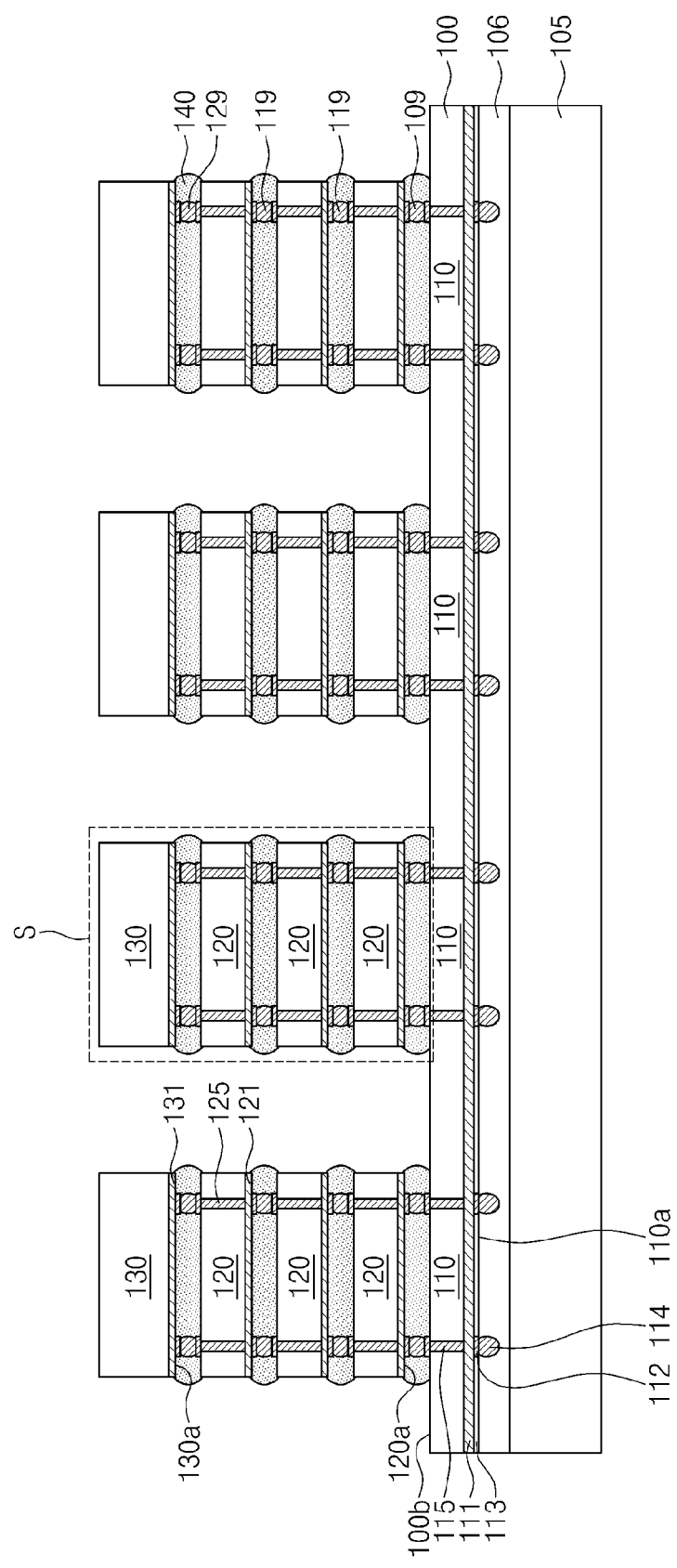

Referring to FIG. 1B, a chip stack S may be mounted on each of the first semiconductor chips 110 of the semiconductor substrate 100. Each chip stack S may include a plurality of staked semiconductor chips 120 and 130. A second semiconductor chip 120 may be mounted on the first semiconductor chip 110 to form a chip-on-wafer (COW) structure. The second semiconductor chip 120 may include a second integrated circuit layer 121 and a second through-via 125. The second integrated circuit layer 121 may include a memory circuit. The second through-via 125 may penetrate the second semiconductor chip 120 and may be electrically connected to the second integrated circuit layer 121. A bottom surface 120a of the second semiconductor chip 120 may comprise an active surface. First bumps 109 may be formed on the bottom surface 120a of the second semiconductor chip 120 to electrically connect the second semiconductor chip 120 to the first semiconductor chip 110. For example, the first bumps 109 may be formed between the first and second semiconductor chips 110 and 120. A plurality of the second semiconductor chips 120 may be sequentially stacked on the first semiconductor chip 110 in FIG. 1B. Alternatively, a single second semiconductor chip 120 may be disposed on the first semiconductor chip 110. If a plurality of second semiconductor chips 120 are provided, second bumps 119 may be formed between the stacked second semiconductor chips 120.

A third semiconductor chip 130 may be mounted on the second semiconductor chip 120. A bottom surface 130a of the third semiconductor chip 130 may comprise an active surface. The third semiconductor chip 130 may include a third integrated circuit layer 131. The third integrated circuit layer 131 may include a memory circuit. The third integrated circuit layer 131 may not have a through-via. A thickness of the third semiconductor chip 130 may be different from that of the second semiconductor chip 120. The thickness of the third semiconductor chip 130 may be adjusted to control the overall thickness of a completed semiconductor package. Third bumps 129 may be formed between the second semiconductor chip 120 and the third semiconductor chip 130. The third semiconductor chip 130 may be electrically connected to the second semiconductor chip 120 through the third bumps 129. In other embodiments, the third semiconductor chip 130 may be omitted.

Adhesive layers 140 formed of an insulating material such as polymer may be provided between the semiconductor chips 110, 120, and 130. For example, each of the adhesive layers 140 may comprise a polymer tape including an insulating material. The adhesive layers 140 may be disposed between the bumps 109, 119, and 129 to substantially prevent electrical shorts of the bumps 109, 119, and 129. The first bumps 119 and the polymer adhesive layer 140 may be adhered to the bottom surface 120a of the second semiconductor chip 120, and the bottom surface 120a of the second semiconductor chip 120 may face a top surface 100b of the semiconductor substrate 100 by a face-down mounting technique. The second semiconductor chips 120 may be mounted on the first semiconductor chip 110 using the first and second bumps 109 and 119. The adhesive layer 140 may also be provided between the second and third semiconductor chips 120 and 130 to substantially prevent the electrical short between the third bumps 129.

In some embodiments, an under-fill layer (not shown) may be formed between the semiconductor chips 110, 120, and 130. In this case, the under-fill layer (not shown) may cover sidewalls of the second semiconductor chips 120 and may fill spaces between the first, second, and third bumps 109, 119, and 129. The process of forming the under-fill layer (not shown) may be performed during each of the mounting process of the second semiconductor chip 120 and the mounting process of the third semiconductor chip 130 or may be performed after the mounting processes of the second and third semiconductor chips 120 and 130 are completed.

Figure 1C:
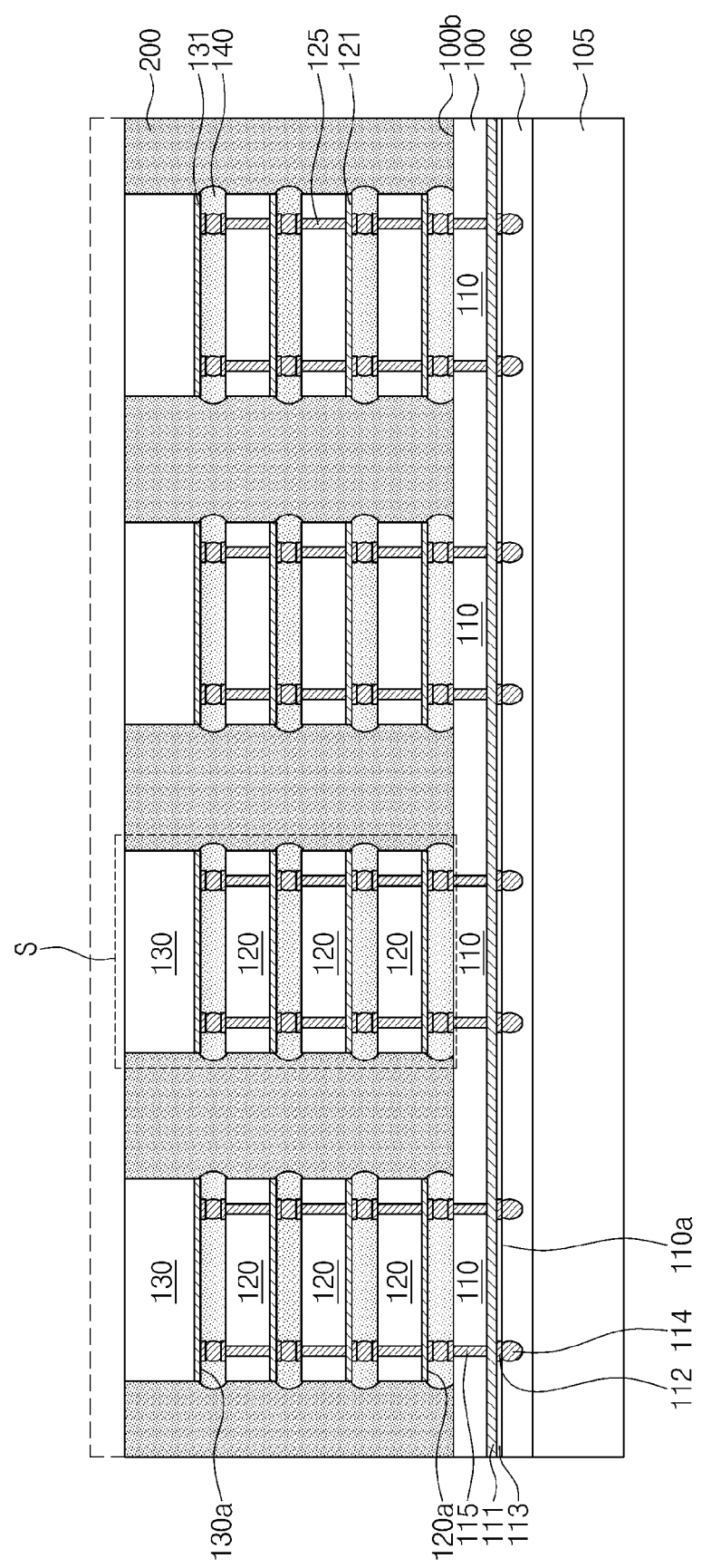

Referring to FIG. 1C, a mold layer 200 may be formed on the top surface 100b of the semiconductor substrate 100 to cover the second and third semiconductor chips 120 and 130. The mold layer 200 may include an insulating polymer material (e.g., an epoxy molding compound). A grinding process or other suitable planarization process may be performed on a top surface of the mold layer 200. In FIG. 1C, a dotted line shows the top surface of the mold layer 200 before the grinding process is performed. A portion of the mold layer 200 may be removed by, for example, the grinding process to expose a top surface of the third semiconductor chip 130. The third semiconductor chip 130 may also be grinded to adjust the thickness of the third semiconductor chip 130. Alternatively, the third semiconductor chip 130 may not be grinded.

Figure 1D:
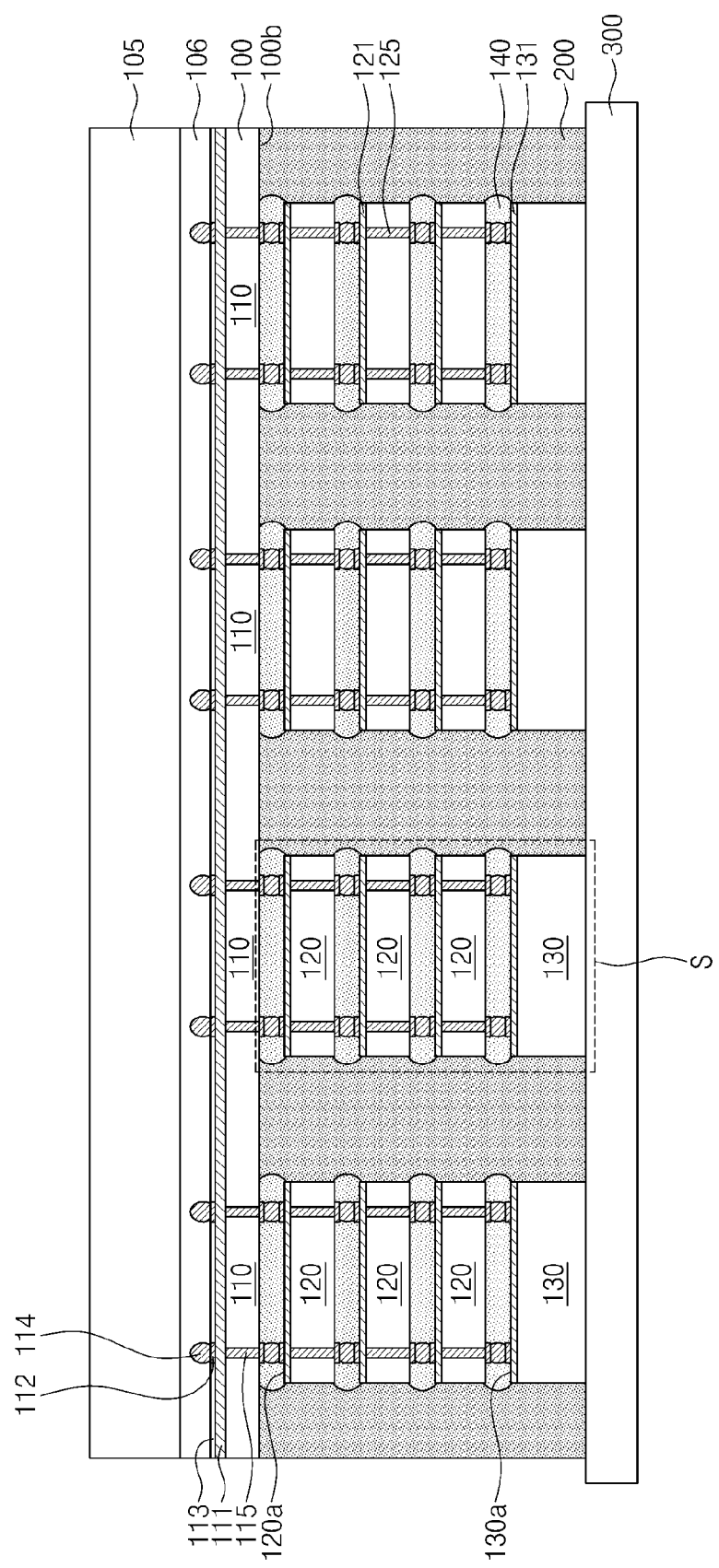

Referring to FIG. 1D, an adhesive film 300 may be adhered to the mold layer 200. The resultant structure having the adhesive film 300 may be turned over, so the semiconductor substrate 100 may be disposed over the adhesive film 300. The top surface 100b of the semiconductor substrate 100 may face the adhesive film 300. In descriptions of the following sawing process, the terms "the top surface" and "the bottom surface" will be used as described with reference to FIGS. 1A to 1C regardless of up and down directions.

Figure 1E:
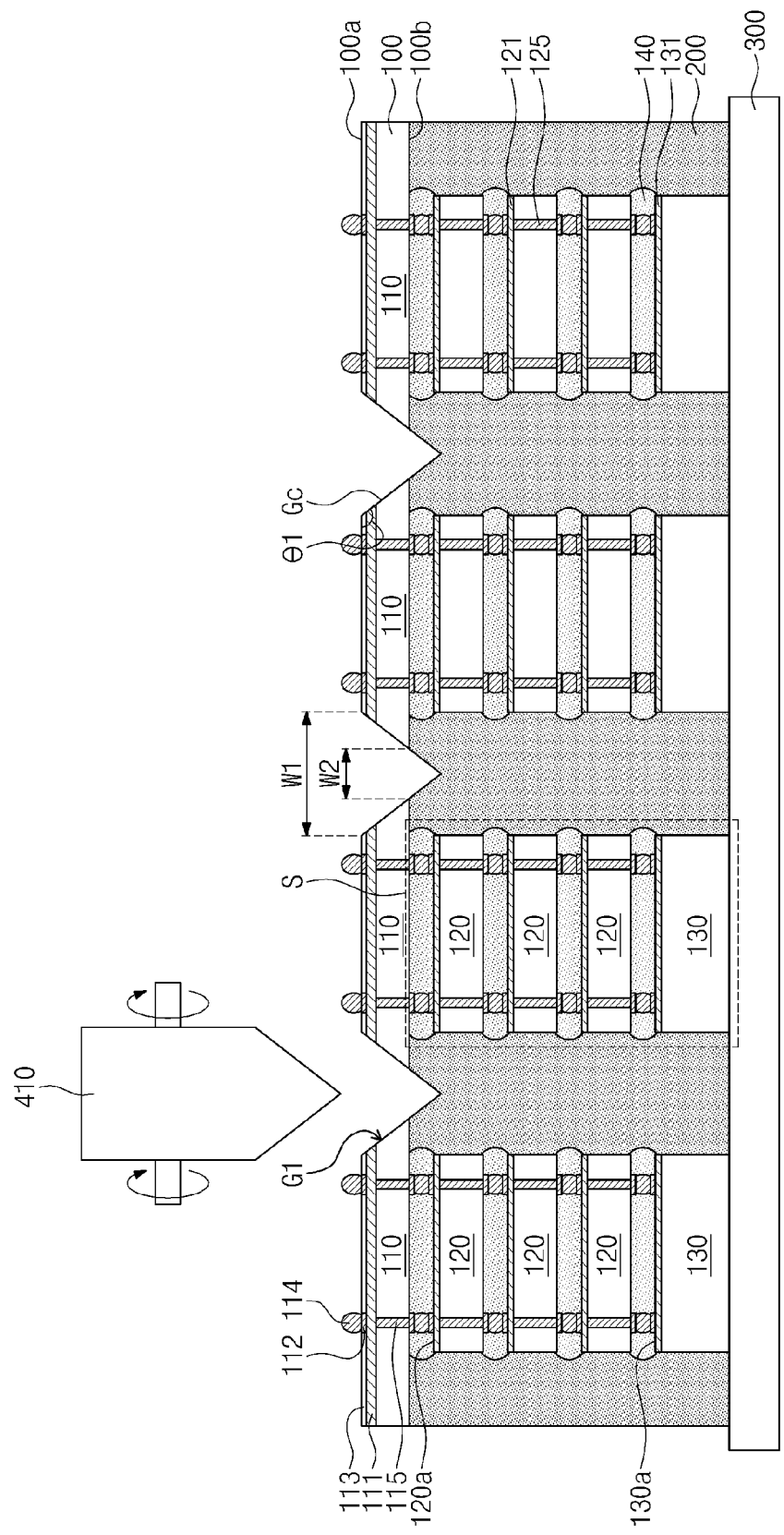

Referring to FIG. 1E, the carrier substrate 105 and the carrier adhesive layer 106 may be removed. A first sawing process may be performed on the bottom surface 100a of the semiconductor substrate 100 toward the mold layer 200 to form a first groove G1. The first sawing process may be performed using a first blade 410 to produce a cut, i.e., the first groove G1 resulting in sidewalls Gc that are inclined at an angle $\theta 1$ with respect to the bottom surface 100a of the semiconductor substrate 100. The first blade 410 may be a bevel blade having inclined surfaces and may have a substantially V-shaped cross-section. Thus, the first groove G1 may have first sidewalls Gc inclined from the bottom surface 100a of the semiconductor substrate 100. The first semiconductor chips 110 and the mold layer 200 may be exposed along the first sidewalls Gc. An angle θ1 between the bottom surface 100a of the semiconductor substrate 100 and the first sidewall Gc may be an obtuse angle. The semiconductor substrate 100 may be divided into one or more first semiconductor chips 110 by the first groove G1. A width W1 of the first groove G1 at the bottom surface 100a of the semiconductor substrate 100 may be greater than a width W2 of the first groove G1 at the top surface 100b of the semiconductor substrate 100.

Figure 1F:
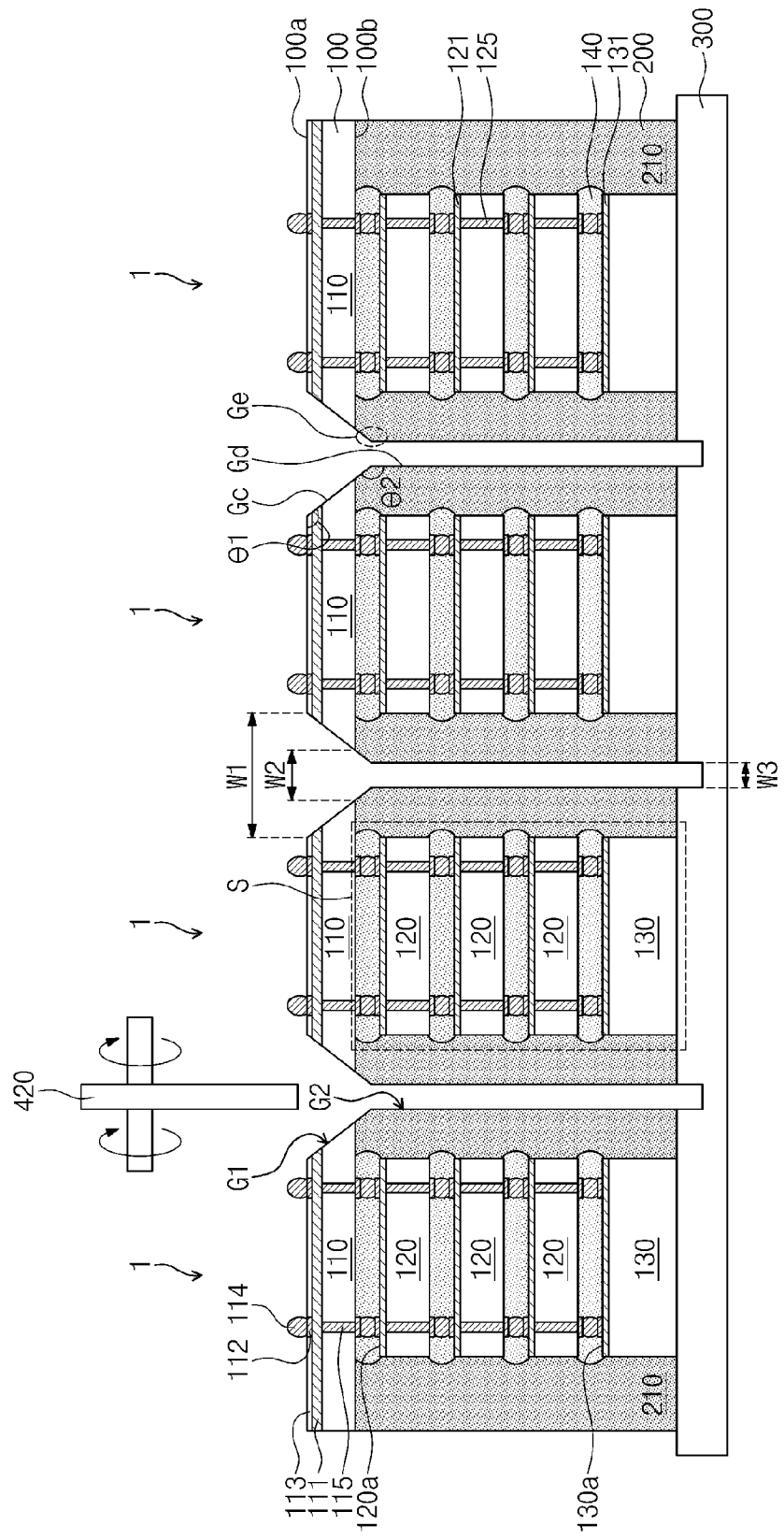

Referring to FIG. 1F, a second sawing process may be performed on the mold layer 200 exposed by the first groove G1 to form a second groove G2 between each pair of adjacent second semiconductor chips 120. The second sawing process may be performed using a second blade 420 of which cross-section has a substantially rectangular shape. The second sawing process may be performed in a direction substantially perpendicular to the top surface 100a of the semiconductor substrate 100, and thus, the second groove G2 may have second sidewalls Gd that are substantially perpendicular to the bottom surface 100a of the semiconductor substrate 100. Since the second sawing process is not performed on the semiconductor substrate 100, the second sidewalls Gd may be spaced apart from the semiconductor substrate 100. The second groove G2 may be formed in the mold layer 200 so as to be connected to the first groove G1. The second groove G2 may further extend into a portion of the adhesive film 300. The second sidewalls Gd may extend from the first sidewalls Gc. An angle θ2 between the first sidewall Gc and the second sidewall Gd may be an obtuse angle. For example, the angle θ2 between the first and second sidewalls Gc and Gd may be in a range of, but not limited to, about 135 degrees to about 150 degrees. Edges Ge may be formed at a location where the first sidewalls Gc meet the second sidewalls Gd in the mold layer 200. A width W3 of the second groove G2 formed in the mold layer 200 may be smaller than a minimum width of the first groove G1 in the semiconductor substrate 100. In other words, the width W3 of the second groove G2 formed in the mold layer 200 by the second sawing process may be smaller than a minimum width of the first groove G1 in the semiconductor substrate 100. For example, the width W3 of the second groove G2 formed in the mold layer 200 may be smaller than the width W2 of the first groove G1 at the top surface 100b of the semiconductor substrate 100. In the present embodiment, the second groove G2 may be spaced apart from the semiconductor substrate 100. In other words, the first groove G1 may include a first region formed in the semiconductor substrate 100 and a second region formed in a portion of the mold layer 200, and the second region of the first groove G2 may be interposed between the second groove G2 and the first region of the first groove G1. In some embodiments, a maximum width (e.g., the width W1) of the groove G1 formed in the semiconductor substrate 100 may be greater than a maximum width (e.g., the width W2) of the groove G1 formed in the mold layer 200. In other words, the groove G1 taper from a greater width to a smaller width.

The second groove G2 may be formed in the mold layer 200 between the chip stacks S. The mold layer 200 may be divided into one or more unit mold layers 210 by the second groove G2. The unit mold layers 210 may be, respectively, provided on the first semiconductor chips 110 separated from each other. The first semiconductor chip 110, the chip stack S, and the unit mold layer 210 covering the first semiconductor chip 110 and the chip stack S may constitute a package unit 1. In the package units 1 adjacent to each other, the minimum distance (e.g., W2) between the first semiconductor chips 110 may be greater than the minimum distance (e.g., W3) between the unit mold layers 210 respectively disposed on the first semiconductor chips 110. Subsequently, the adhesive film 300 may be removed to complete the fabrication of the package units 1. The package units 1 may correspond to semiconductor packages according to some embodiments of the inventive concepts.

Figure 1G:
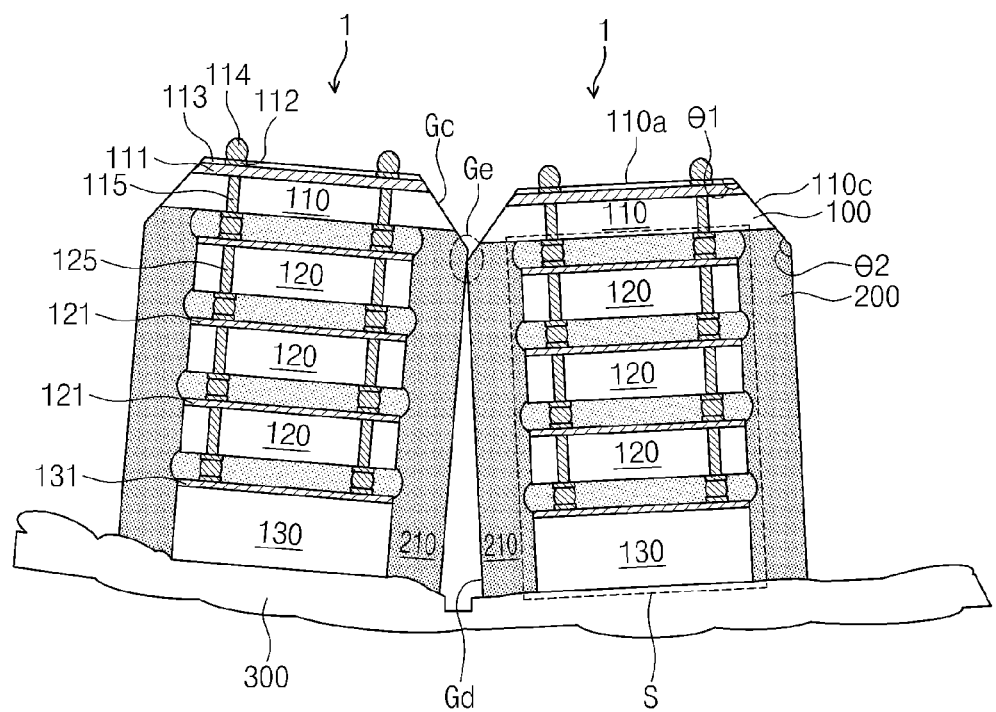
FIG. 1G is an enlarged cross-sectional view of package units after a singulation process such as a sawing process.

FIG. 1G is an enlarged cross-sectional view of package units after a singulation process such as a sawing process. The sawing process of the embodiments will be described hereinafter.

Referring to FIGS. 1F and 1G, if the package units 1 are separated from each other by the grooves G1 and G2, the adhesive film 300 may be shrunk. As a result, the shape of the adhesive film 300 may be modified. In turn, the package units 1 may come in contact with each other, resulting in damage to the first semiconductor chips 110. According to some embodiments of the inventive concepts, since the edges Ge may be formed in the mold layer 200, the first semiconductor chips 110 may not come in contact with each other. For example, the maximum width W1 of the first groove G1 formed in the semiconductor substrate 100 may be greater than the minimum width (e.g., the width W3) of the groove G2 formed in the mold layer 200, as illustrated in FIG. 1F. Thus, the unit mold layers 210 may come in contact with each other by the modification of the adhesive film 300, as illustrated in FIG. 1G.

The physical strength of the first semiconductor chips 110 may be weaker than that of the mold layer 200/the unit mold layer 210. For example, mechanical and physical strengths of silicon-containing materials of the first semiconductor chips 110 may be weaker than that of a polymer (e.g., the epoxy molding compound). If an additional polymer layer is not formed on the bottom surface 110a of the first semiconductor chip 110, the silicon nitride layer 113 may be exposed. Sidewalls 110c of the first semiconductor chips 110 separated from each other may not be covered with the unit mold layers 210. The damage to the first semiconductor chips 110 may deteriorate the reliability of a semiconductor package. According to some embodiments of the inventive concepts, if the adhesive film 300 is modified, the unit mold layers 210 may come in contact with each other. In other words, even when the package units 1 come in contact with each other, the first semiconductor chips 110 do not come in contact with each other. Thus, damage to the first semiconductor chips 110 can be substantially prevented or reduced. Thus, the reliability of the semiconductor package can be improved. The second blade 420 may be spaced apart from the first semiconductor chips 110 during the second sawing process, so cracks caused by the second blade 420 may not be formed on the first semiconductor chips 110. In addition, the time during which the first semiconductor chips 110 are exposed during the sawing process may be reduced to more effectively prevent damage to the first semiconductor chips 110.

The package unit (i.e., the semiconductor package) fabricated according to some embodiments will be described hereinafter.

Figure 1H:
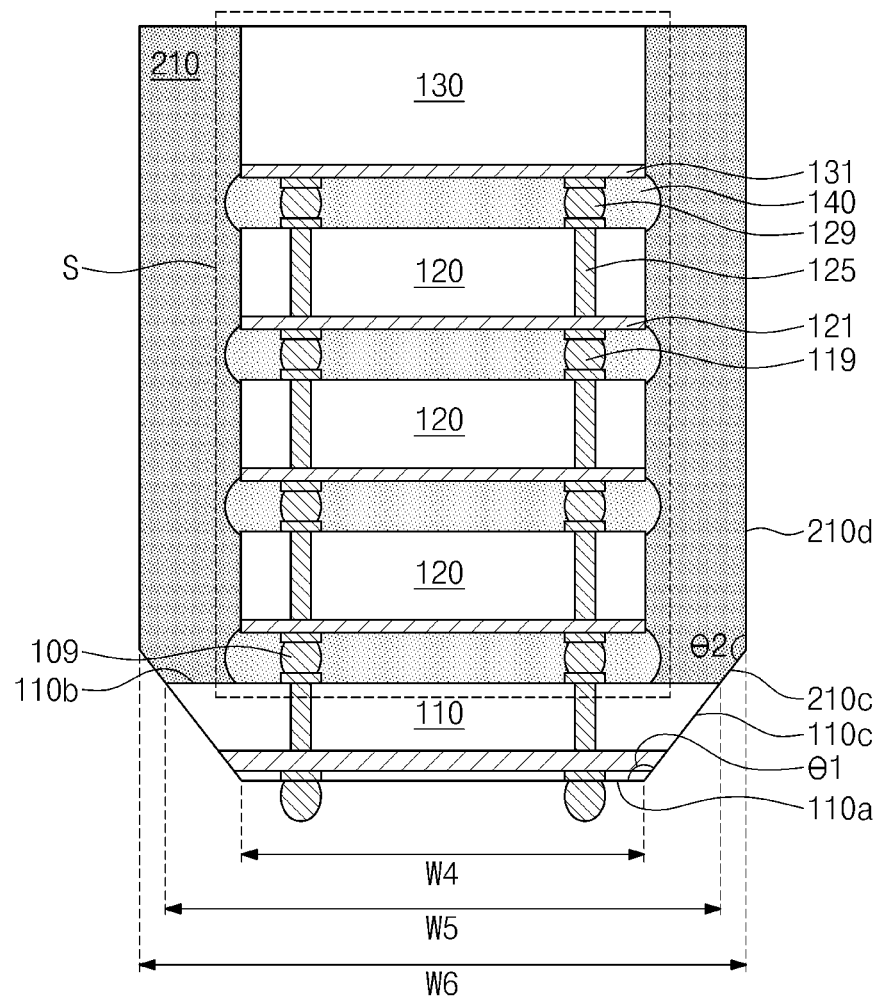
FIG. 1H is a cross-sectional view illustrating one of package units fabricated according to some embodiments of the inventive concepts.
Figure 1I:
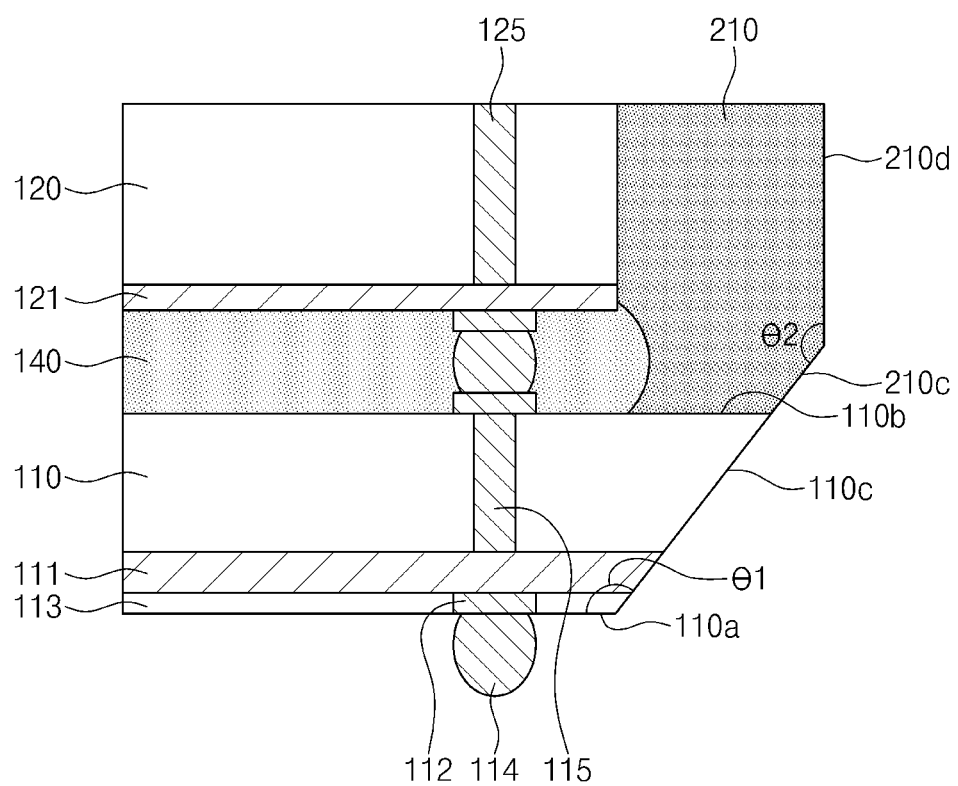
FIG. 1I is an enlarged view of a first semiconductor chip and a mold layer of FIG. 1H.

FIG. 1H is a cross-sectional view illustrating one of package units fabricated according to some embodiments of the inventive concepts, and FIG. 1I is an enlarged view of a first semiconductor chip and a mold layer of FIG. 1H.

Hereinafter, the same descriptions as mentioned above will be omitted or described briefly for the purpose of ease and convenience in explanation.

Referring to FIGS. 1H and 1I, the package unit 1 may include a first semiconductor chip 110, a second semiconductor chip 120, and a third semiconductor chip 130, which are sequentially stacked. The first to third semiconductor chips 110, 120, and 130 may be substantially the same as or similar to the semiconductor chips 110, 120, and 130 described with reference to FIGS. 1A to 1F. In some embodiments, a plurality of second semiconductor chips 120 may be provided. The third semiconductor chip 130 may be omitted. The first semiconductor chip 110 may have a bottom surface 110a, a top surface 110b, and sidewalls 110c connected between edges of the bottom and top surfaces 110a and 110b. A unit mold layer 210 may be exposed along sidewalls 110c and may be inclined with respect to the bottom surface 110a. For example, an angle θ1 between the bottom surface 110a and the sidewall 110c may be an obtuse angle. Since the first semiconductor chip 110 has the inclined sidewalls 110c, it may not be easily damaged by an external impact. The width of the first semiconductor chip 110 may become progressively greater from the bottom surface 110a toward the top surface 110b. In other words, the width W4 of the bottom surface 110a of the first semiconductor chip 110 may be smaller than the width W5 of the top surface 110b of the first semiconductor chip 110.

The unit mold layer 210 may have inclined sidewalls 210c and vertical sidewalls 210d. The inclined sidewalls 210c may be substantially coplanar with the corresponding sidewalls 110c of the first semiconductor chip 110 and may therefore be inclined at substantially the same angle as the corresponding sidewalls 110c. The angle of inclination θ1 may be an obtuse angle with respect the bottom surface 110a. Each of the inclined sidewalls 210c may be provided between the bottom surface 110a of the first semiconductor chip 110 and each of the vertical sidewalls 210d. The vertical sidewalls 210d may be substantially perpendicular to the bottom surface 110a of the first semiconductor chip 110. The vertical sidewalls 210d may be spaced apart from the first and second semiconductor chips 110 and 120. An angle θ2 between the inclined sidewall 210c and the vertical sidewall 210d may be an obtuse angle. Edges may be formed at a location where the inclined sidewalls 210c meet the vertical sidewalls 210d on the unit mold layer 210. The width W6 of the unit mold layer 210 may be greater than the maximum width (e.g., the width W5 of the top surface 110b) of the first semiconductor chip 110. The first sidewalls Gc of the grooves G1 and G2 described with reference to FIG. 1F may correspond to the sidewalls 110c of the first semiconductor chip 110 and the inclined sidewalls 210c of the unit mold layer 210. The second sidewalls Gd of the grooves G1 and G2 described with reference to FIG. 1F may correspond to the vertical sidewalls 210d of the unit mold layer 210. A top surface of the third semiconductor chip 130 may be exposed between a pair of unit mold layers 210.

Figure 2A:
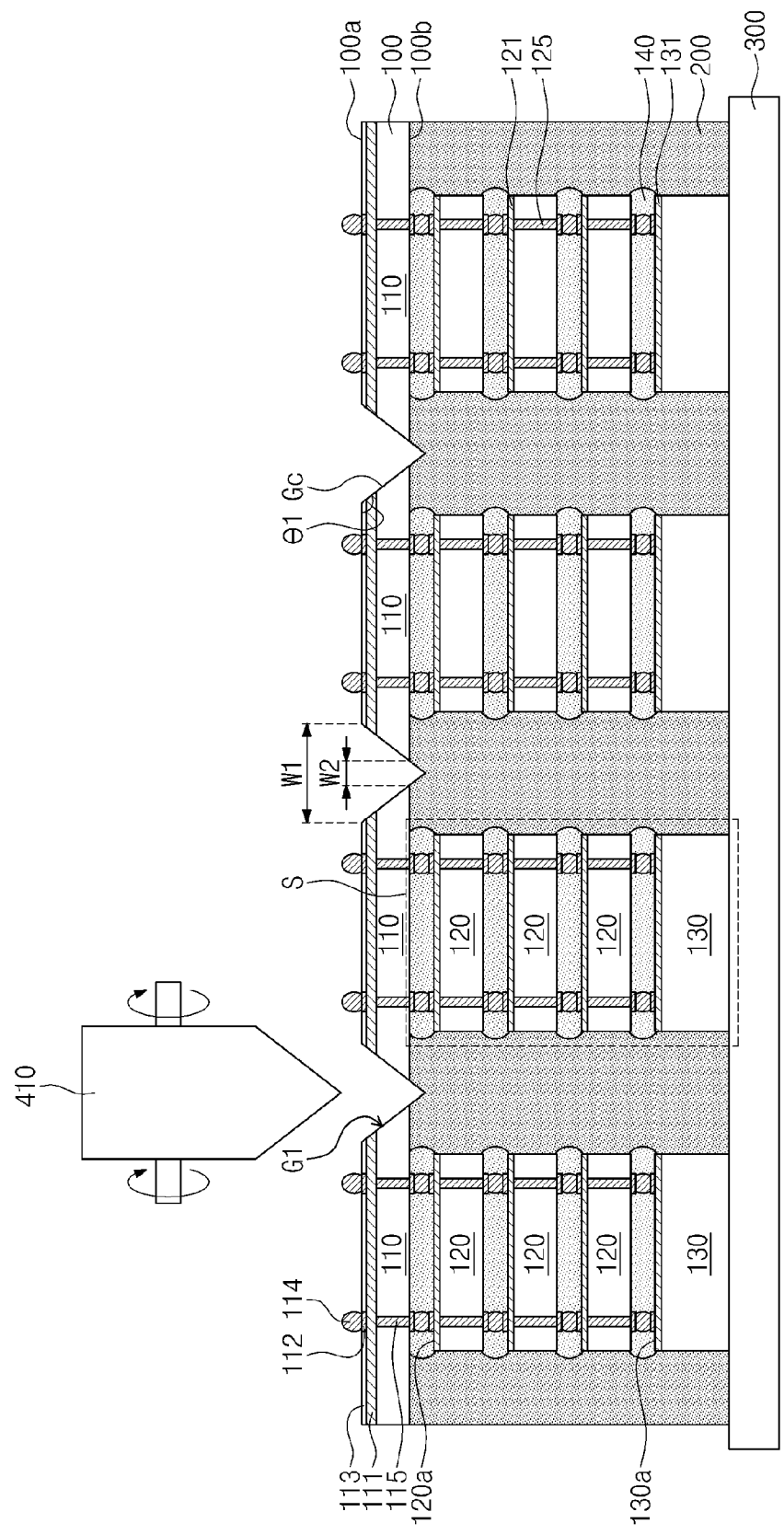
FIGS. 2A and 2B are cross-sectional views illustrating a method of fabricating a semiconductor package according to other embodiments of the inventive concepts.
Figure 2B:
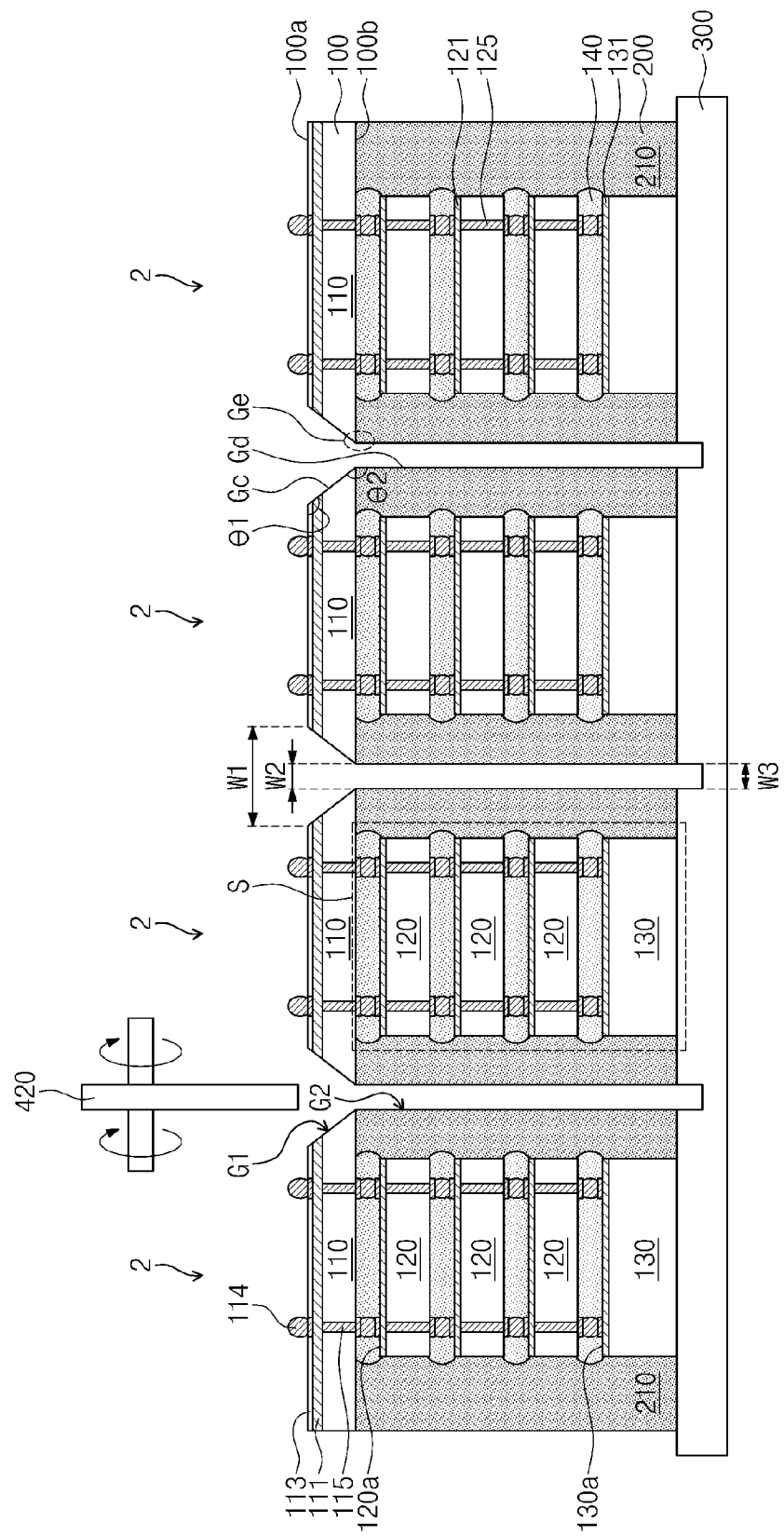
Figure 2C:
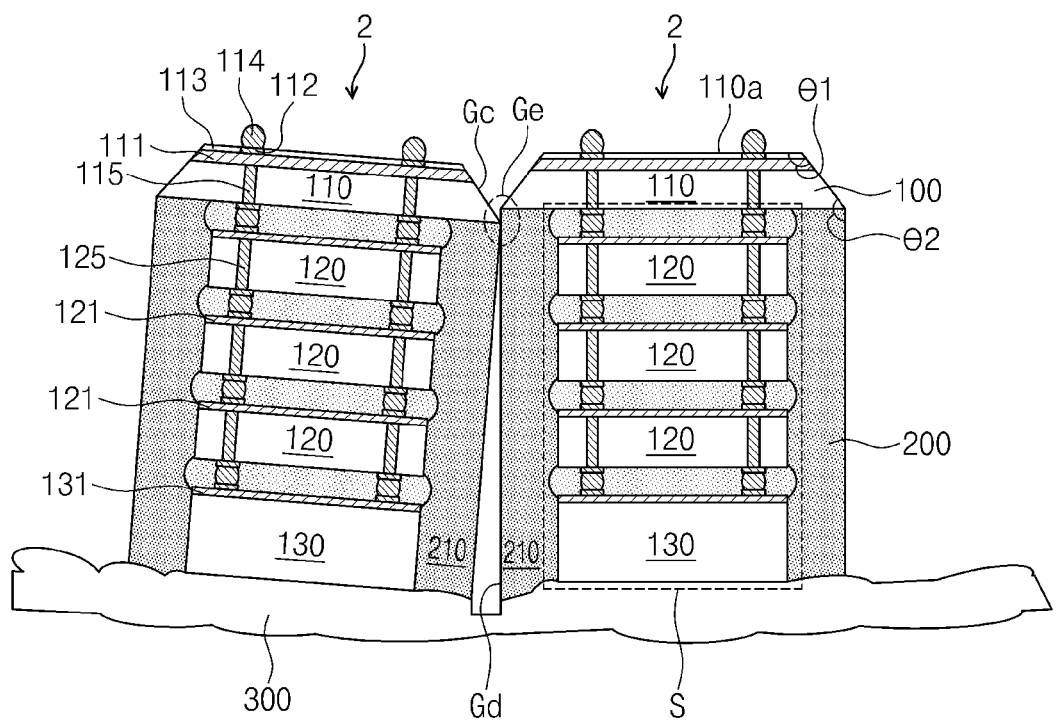
FIG. 2C is a cross-sectional view illustrating an example of package units after a singulation process such as a sawing process.

FIGS. 2A and 2B are cross-sectional views illustrating a method of fabricating a semiconductor package according to other embodiments of the inventive concepts, and FIG. 2C is a cross-sectional view illustrating an example of package units after a singulation process such as a sawing process. The same descriptions as described in the above embodiment will be omitted or mentioned briefly to avoid redundancy. In other words, differences between the present embodiment and the above embodiment will be mainly described hereinafter.

Referring to FIG. 2A, a first sawing process may be performed on the bottom surface 100a of the semiconductor substrate 100. For example, the second semiconductor chip 120, the third semiconductor chip 130, and the mold layer 200 may be formed on the top surface 100b of the semiconductor substrate 100, as described with reference to FIGS. 1A to 1C. As described with reference to FIG. 1D, the semiconductor substrate 100 may be provided on the adhesive film 300, so the top surface 100b (or active surface) of the semiconductor substrate 100 may face the adhesive film 300.

The first sawing process may be performed on the bottom surface 100a of the semiconductor substrate 100 toward the mold layer 200, thereby forming a first groove G1 between each pair of adjacent first semiconductor chips 110. The first groove G1 may have first sidewalls Gc inclined with respect to the bottom surface 100a of the semiconductor substrate 100. An angle θ1 between the bottom surface 100a of the semiconductor substrate 100 and the first sidewall Gc may be an obtuse angle. The semiconductor substrate 100 and the mold layer 200 may be exposed along the sidewalls Gc. The width W1 of the first groove G1 at the bottom surface 100a of the semiconductor substrate 100 may be greater than the width W2 of the first groove G1 at the top surface 100b of the semiconductor substrate 100. The semiconductor substrate 100 may be divided into a plurality of the first semiconductor chips 110 by the first groove G1.

Referring to FIG. 2B, a second sawing process may be performed on the mold layer 200 exposed by the first groove G1 to form a second groove G2. The second sawing process may be performed in a direction substantially perpendicular to the bottom surface 100a of the semiconductor substrate 100. Thus, the second groove G2 may have second sidewalls Gd which are substantially perpendicular to the bottom surface 100a of the semiconductor substrate 100. The second sawing process may be performed adjacent to the semiconductor substrate 100. However, the second sawing process may not be performed on the semiconductor substrate 100. Consequently, the time during which the first semiconductor chips 110 are exposed during the sawing process may be reduced. In addition, the first semiconductor chips 110 may not be physically damaged by the second blade 420. For example, cracks may not be caused in the first semiconductor chips 110.

The second groove G2 may be formed in the first groove G1, so a portion of the first sidewall Gc may be removed. After the formation of the second groove G2, the first semiconductor chips 110 may be exposed along the sidewalls Gc, but may not be exposed through the mold layer 200. The mold layer 200 may be exposed along the second groove G2, which may be connected to the first groove G1. The second sidewalls Gd may extend from the first sidewalls Gc. An angle θ2 between the first sidewall Gc and the second sidewall Gd may be an obtuse angle. In the present embodiment, edges Ge may be formed at interfaces between the mold layer 200 and the first semiconductor chips 110.

The width W3 of the groove G2 formed in the mold layer 200 may be smaller than the width W1 of the groove G1 at the bottom surface 100a of the semiconductor substrate 100 and may be substantially equal to the width W2 of the groove G1 at the top surface 100b of the semiconductor substrate 100.

The second groove G2 may be formed in the mold layer 200 between the chip stacks S. The mold layer 200 may be divided into one or more unit mold layers 210 by the second groove G2. The unit mold layers 210 may be provided on the first semiconductor chips 110, respectively. With the second groove G2, package units 2 may be separated from each other. Each of the package units 2 may include the first semiconductor chip 110, the chip stack S disposed on the first semiconductor chip 110, and the unit mold layer 210 covering the first semiconductor chip 110 and the chip stack S. The package units 2 correspond to the semiconductor packages according to the present embodiment. In the package units 2 adjacent to each other, the minimum distance between the first semiconductor chips 110 may be substantially equal to or greater than the minimum distance between the unit mold layers 210 respectively disposed on the first semiconductor chips 110.

Referring to FIGS. 2C and 2B, if the package units 2 are separated from each other by the grooves G1 and G2, the adhesive film 300 may be shrunk. As illustrated in FIG. 2B, the maximum width W3 of the groove G2 formed in the mold layer 200 may be substantially equal to the minimum width (e.g., the width W1 at the top surface 100b) of the groove G1 formed in the semiconductor substrate 100. Even if the adhesive film 300 is modified, the unit mold layers 210 of the adjacent package units 2 may come in contact with each other. In other embodiments, the unit mold layer 210 of one of the adjacent package units 2 may come in contact with the first semiconductor chip 110 of the other of the adjacent package units 2. According to the present embodiment, the first semiconductor chips 110 may hardly come into contact with each other. Thus, reliability of the semiconductor package may be improved.

The package unit 2 according to the present embodiment will be described hereinafter.

Figure 2D:
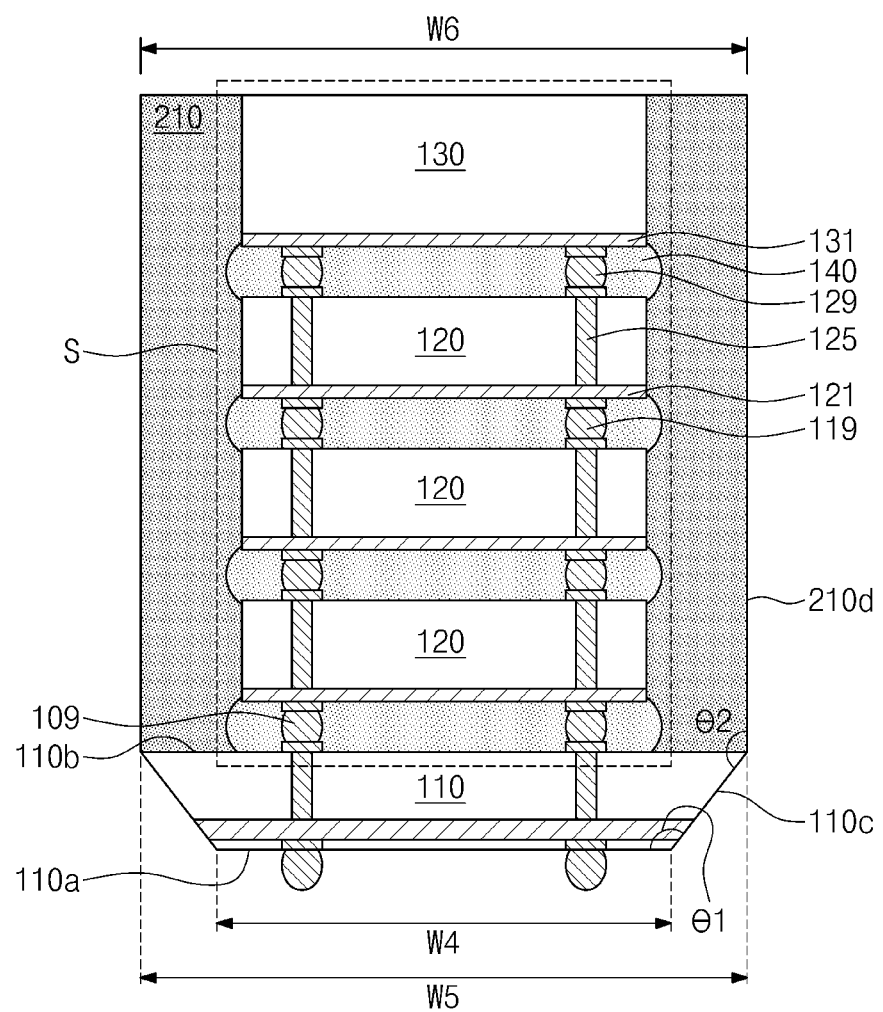
FIG. 2D is a cross-sectional view illustrating one of package units fabricated according to other embodiments of the inventive concepts.
Figure 2E:
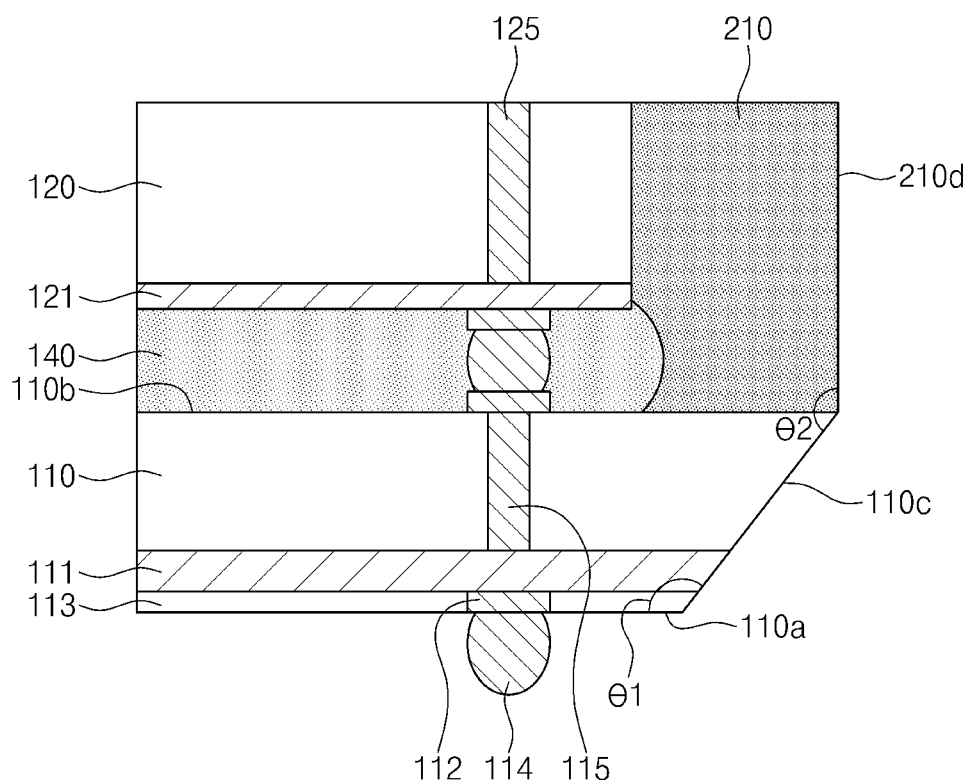
FIG. 2E is an enlarged view of a first semiconductor package and a mold layer of FIG. 2D.

FIG. 2D is a cross-sectional view illustrating one of package units fabricated according to other embodiments of the inventive concepts, and FIG. 2E is an enlarged view of a first semiconductor package and a mold layer of FIG. 2D. The same descriptions as described above will be omitted or mentioned briefly to avoid redundancy.

Referring to FIGS. 2D and 2E, the package unit 2 may include a first semiconductor chip 110, a second semiconductor chip 120, and a third semiconductor chip 130, which are sequentially stacked. The first to third semiconductor chips 110, 120, and 130 may be the same as or similar to the semiconductor chips 110, 120, and 130 described above. Sidewalls 110c of the first semiconductor chip 110 may be connected between edges of the bottom surface 110a and the top surface 110b and may be inclined. The angle θ1 between the bottom surface 110a and the sidewall 110c may be an obtuse angle. The width of the first semiconductor chip 110 may become progressively greater from the bottom surface 110a toward the top surface 110b. For example, the width W4 of the bottom surface 110a of the first semiconductor chip 110 may be smaller than the width W5 of the top surface 110b of the first semiconductor chip 110. The first semiconductor chip 110 according to the present embodiment may not be damaged by an external impact, as compared with a semiconductor chip in which an angle between a bottom surface and a sidewall is a right angle.

A unit mold layer 210 may have vertical sidewalls 210d. The vertical sidewalls 210d may be substantially perpendicular to the bottom surface 110a of the first semiconductor chip 110. The angle θ2 between the vertical sidewall 210d of the unit mold layer 210 and the sidewall 110c of the first semiconductor chip 110 may be an obtuse angle. The edges may be formed at the interface between the first semiconductor chip 110 and the unit mold layer 210. The width W6 of the unit mold layer 210 may be substantially equal to the width W5 of the top surface 110b of the first semiconductor chip 110 and may be greater than the width W4 of the bottom surface 110a of the first semiconductor chip 110. The sidewalls 110c of the first semiconductor chip 110 may correspond to the first sidewalls Gc described with reference to FIGS. 2A and 2B, and the vertical sidewalls 210d of the unit mold layer 210 may correspond to the second sidewalls Gd described with reference to FIG. 2B.

Figure 3A:
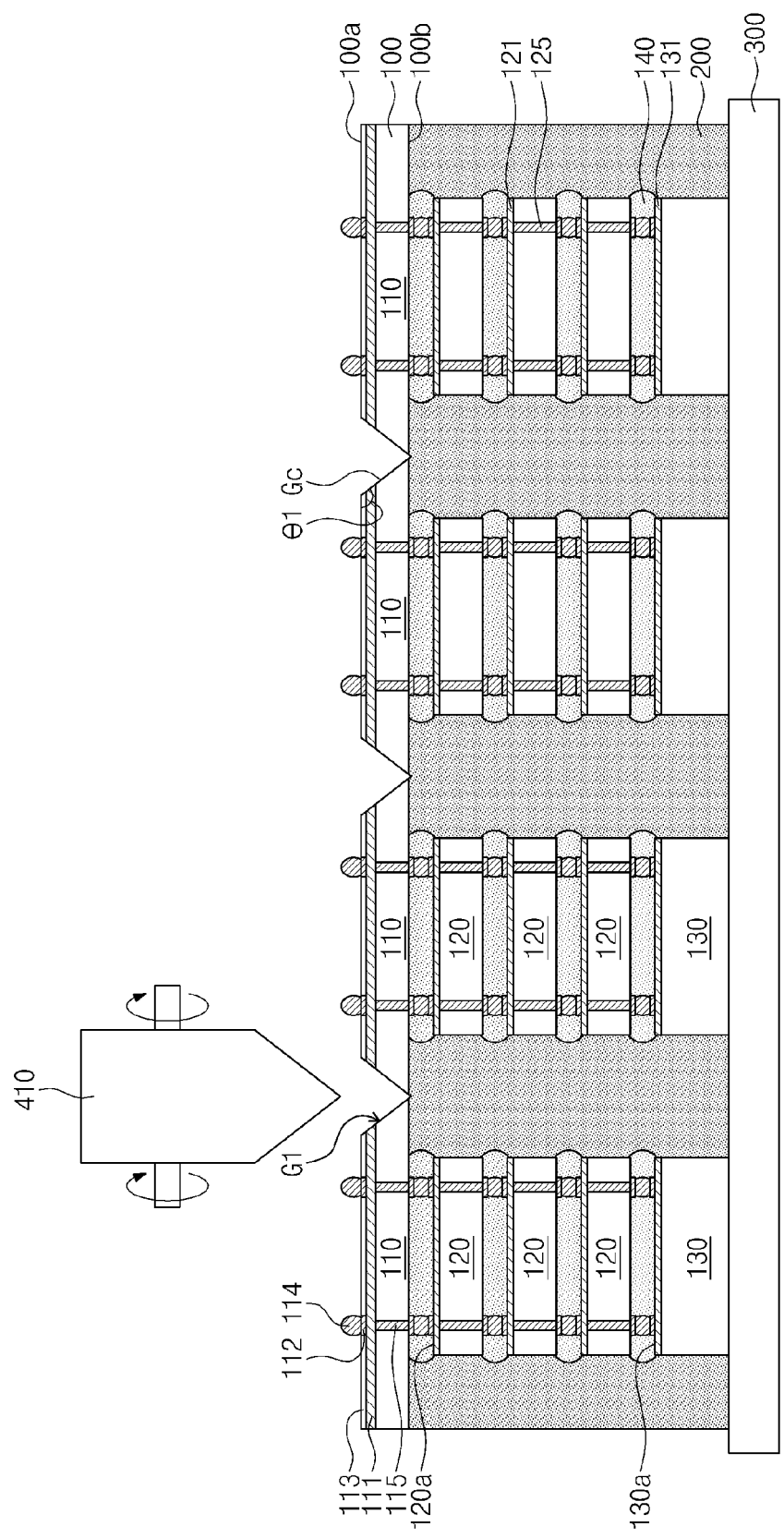
FIGS. 3A and 3B are cross-sectional views illustrating a method of fabricating a semiconductor package according to still other embodiments of the inventive concepts.
Figure 3B:
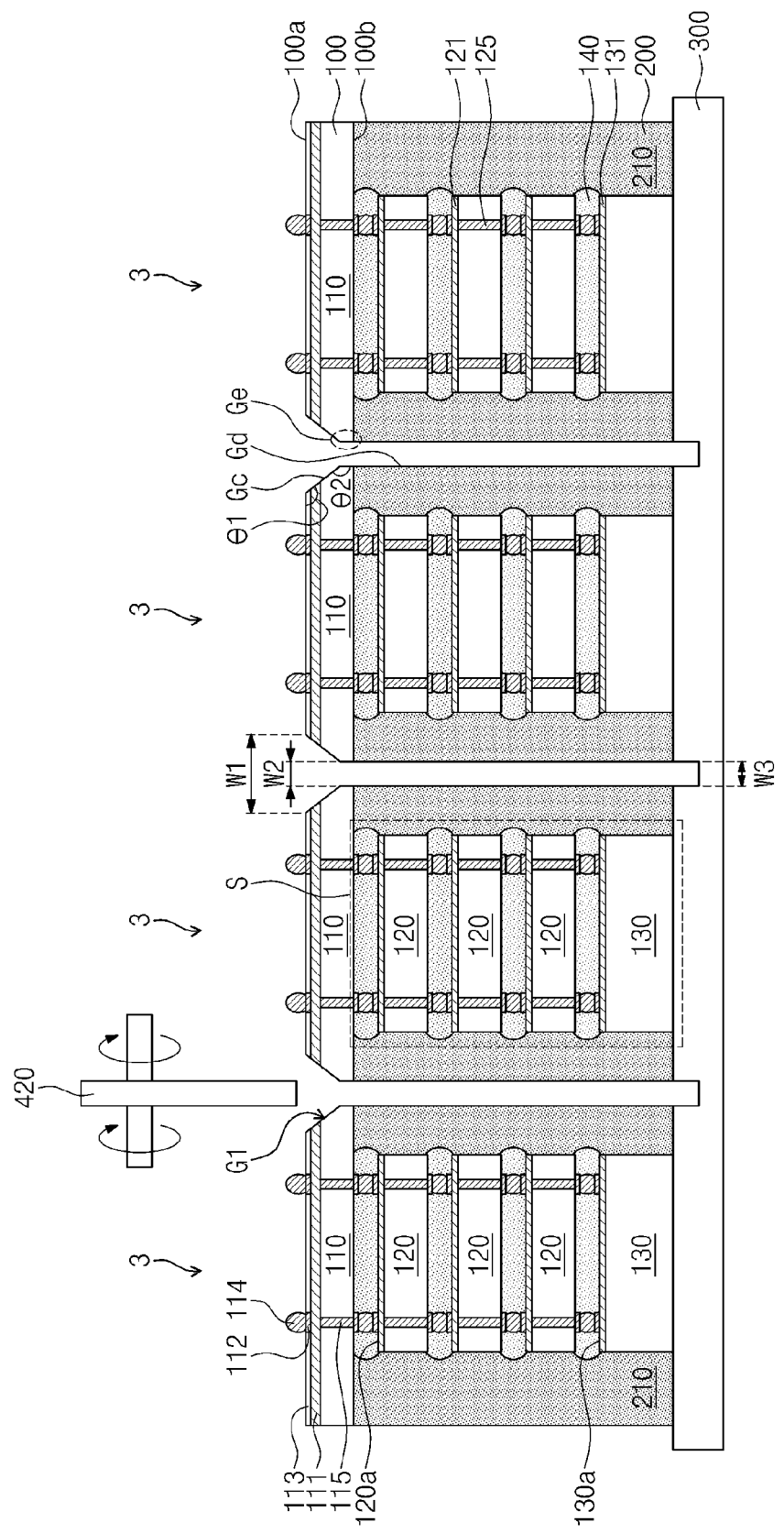
Figure 3C:
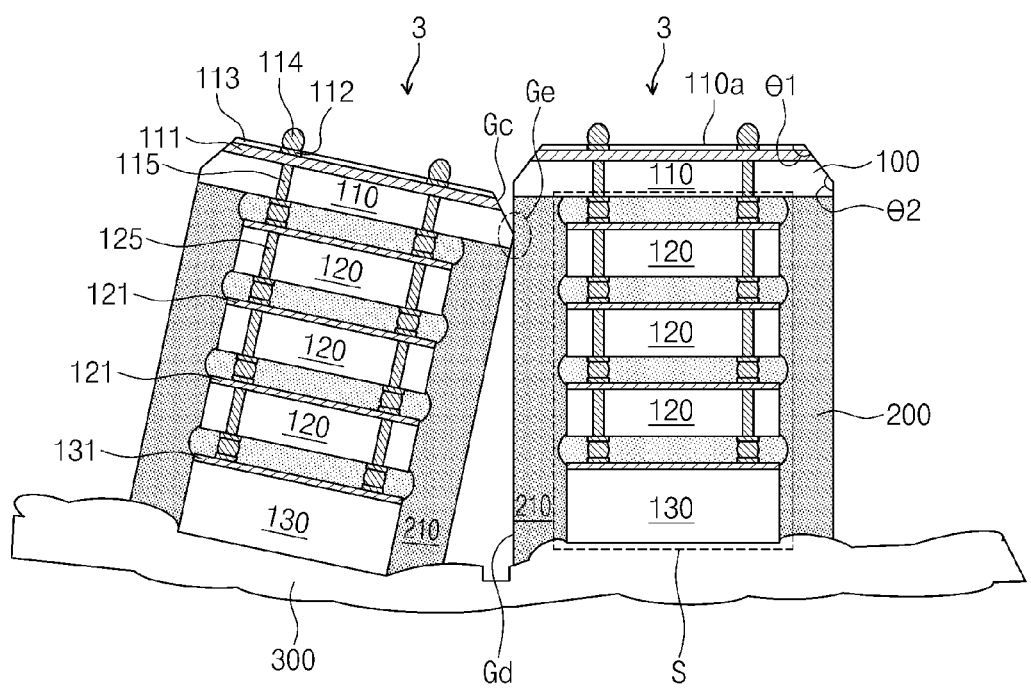
FIG. 3C is a cross-sectional view illustrating an example of package units after a singulation process such as a sawing process.

FIGS. 3A and 3B are cross-sectional views illustrating a method of fabricating a semiconductor package according to still other embodiments of the inventive concepts. FIG. 3C is a cross-sectional view illustrating an example of package units after a singulation process such as a sawing process. The same descriptions as described in the above embodiments will be omitted or mentioned briefly to avoid redundancy. In other words, differences between the present embodiment and the above embodiments will be mainly described hereinafter.

Referring to FIG. 3A, a first sawing process may be performed on the bottom surface 100a of the semiconductor substrate 100. For example, the second semiconductor chip 120, the third semiconductor chip 130, and the mold layer 200 may be provided on the top surface 100b of the semiconductor substrate 100, as described with reference to FIGS. 1A to 1C. As described with reference to FIG. 1D, the semiconductor substrate 100 may be provided on the adhesive film 300, so the top surface (or active surface) 100b of the semiconductor substrate 100 may face the adhesive film 300.

The first sawing process may be performed on the bottom surface 100a of the semiconductor substrate 100 toward the mold layer 200, thereby forming a first groove G1 between each pair of adjacent first semiconductor chips 110. The first groove G1 may have first sidewalls Gc inclined with respect to the bottom surface 100a of the semiconductor substrate 100. The angle θ1 between the bottom surface 100a of the semiconductor substrate 100 and the first sidewall Gc may be an obtuse angle. The semiconductor substrate 100 and portions of the mold layer 200 may be exposed along the first sidewalls Gc. In other embodiments, the semiconductor substrate 100 may be exposed along the first sidewalls Gc, but not the mold layer 200.

Referring to FIG. 3B, a second sawing process may be performed in the first groove G1 to form a second groove G2. The second sawing process may be performed in a direction perpendicular to the bottom surface 100a of the semiconductor substrate 100. Thus, the second groove G2 may have second sidewalls Gd which extend in the direction substantially perpendicular to the bottom surface 100a of the semiconductor substrate 100. The second blade 420 used in the second sawing process may cut the semiconductor substrate 100 and the mold layer 200 which are exposed by the first groove G1. Portions of the first sidewalls Gc may be removed when the second groove G2 is formed. After the formation of the second groove G2, the first semiconductor chips 110 may be exposed along the sidewalls Gc, but may not be exposed through the mold layer 200. The second groove G2 may be connected to or in communication with the first groove G1, and the second sidewalls Gd may extend from the first sidewalls Gc, respectively. The semiconductor substrate 100 and the mold layer 200 may be exposed along the second sidewalls Gd. An angle θ2 between the first sidewall Gc and the second sidewall Gd may be an obtuse angle. In the present embodiment, edges Ge may be formed at a location where the first sidewalls Gc meet the second sidewalls Gd on sidewalls of the first semiconductor chips 110. The width W3 of the groove G2 formed in the mold layer 200 may be smaller than the width W1 of the groove G1 at the bottom surface 100a of the semiconductor substrate 100 and may be substantially equal to the width W2 of the groove G1 at the top surface 100b of the semiconductor substrate 100.

With the first and second grooves G1 and G2, the semiconductor substrate 100 may be divided into one or more first semiconductor chips 110 and the mold layer 200 may be divided into one or more unit mold layers 210. Thus, package units 3 may be fabricated. The package units 3 correspond to semiconductor packages according to the present embodiment. In the package units 3 adjacent to each other, the distance between the first semiconductor chips 110 may be equal to or greater than a distance between the unit mold layers 210 respectively disposed on the first semiconductor chips 110.

The sawing process of the present embodiment will be described in more detail hereinafter.

Referring to FIGS. 3C and 3B, the shape of the adhesive film 300 may be modified, so the package units may come in contact with each other. According to the present embodiment, the edges Ge having an obtuse angle may be formed in the grooves G1 and G2. Thus, the first semiconductor chips 110 may withstand an external impact. In addition, the probability of contact between the first semiconductor chips may be reduced. For example, the unit mold layer 210 of one of the package units 3 may come in contact with the first semiconductor chip 110 of an adjacent package unit 3. As a result, the reliability of the package unit (i.e., the semiconductor package) may be improved.

The package unit fabricated according to the present embodiment will be described hereinafter.

Figure 3D:
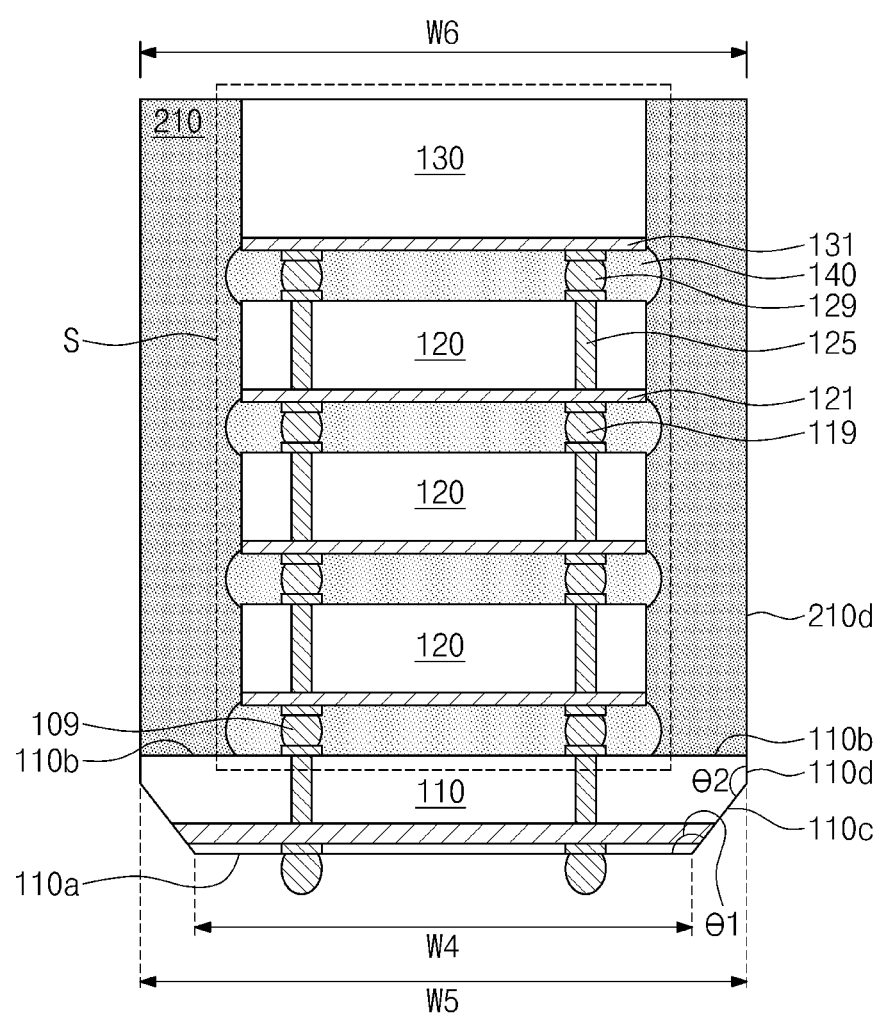
FIG. 3D is a cross-sectional view illustrating one of package units fabricated according to still other embodiments of the inventive concepts.
Figure 3E:
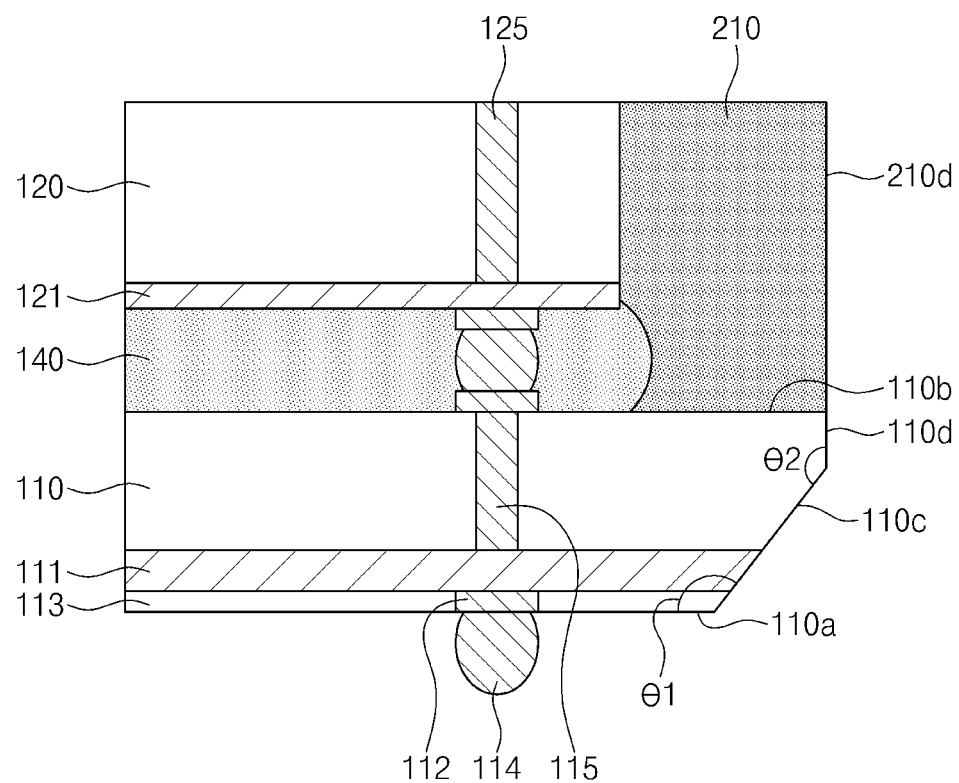
FIG. 3E is an enlarged view of a first semiconductor package and a mold layer of FIG. 3D.

FIG. 3D is a cross-sectional view illustrating one of package units fabricated according to still other embodiments of the inventive concepts, and FIG. 3E is an enlarged view of a first semiconductor package and a mold layer of FIG. 3D. The same descriptions as described above will be omitted or mentioned briefly to avoid redundancy.

Referring to FIGS. 3D and 3E, the package unit 3 may include a first semiconductor chip 110, a second semiconductor chip 120, and a third semiconductor chip 130, which are sequentially stacked. The first to third semiconductor chips 110, 120, and 130 may be the same as or similar to the semiconductor chips 110, 120, and 130 described above. The first semiconductor chip 110 may have first sidewalls 110c and second sidewalls 110d provided between a bottom surface 110a and a top surface 110b. The first sidewalls 110c may be adjacent to the bottom surface 110a. The angle θ1 between the bottom surface 110a and the first sidewall 110c may be an obtuse angle. Thus, the first semiconductor chip 110 of the present embodiment may withstand the external impact, as compared with a semiconductor chip in which an angle between a bottom surface and a sidewall is a right angle. The second sidewalls 110d may be substantially perpendicular to the bottom surface 110a. The second sidewalls 110d may be adjacent to the top surface 110b and may be connected between the top surface 110b the first sidewalls 110c. The angle θ2 between the first sidewall 110c and the second sidewall 110d may be an obtuse angle. Edges Ge may be formed at a location where the first sidewalls 110c meet the second sidewalls 110d on sidewalls of the first semiconductor chip 110. The width of the first semiconductor chip 110 may become progressively greater from the bottom surface 110a to the edges Ge and may be uniform from the edges Ge to the top surface 110b. The width W4 of the bottom surface 110a of the first semiconductor chip 110 may be smaller than a width W5 of the top surface 110b of the first semiconductor chip 110. The first sidewalls 110c and the second sidewalls 110d may be exposed by the unit mold layer 210.

The unit mold layer 210 may have vertical sidewalls 210d. The vertical sidewalls 210d may be substantially perpendicular to the bottom surface 110a of the first semiconductor chip 110. The vertical sidewalls 210d may extend from the second sidewalls 110d of the first semiconductor chip 110 and may be substantially coplanar with the second sidewalls 110d. The width W6 of the unit mold layer 210 may be substantially equal to the width W5 of the top surface 110b of the first semiconductor chip 110 and may be greater than the width W4 of the bottom surface 110a of the first semiconductor chip 110. The first sidewalls 110c of the first semiconductor chip 110 may correspond to the first sidewalls Gc of the first groove G1 described with reference to FIG. 3B. The second sidewalls 110d of the first semiconductor chip 110 and the vertical sidewalls 210d of the unit mold layer 210 may correspond to the second sidewalls Gd of the second groove G2 described with reference to FIG. 3B.

In the embodiments described above, the second groove G2 is formed after the first groove G1. Although not illustrated, however, the first groove G1 may be formed after the second groove G2, depending on the applications according to some other embodiments of the inventive concepts. Also, it may also be possible that the first groove G1 and the second groove G2 may be formed in the same process using a suitable blade, e.g., a blade having both a substantially rectangular cross-section and a substantially V-shaped cross-section, within the spirit and scope of the inventive concepts.

[Applications]

Figure 4:
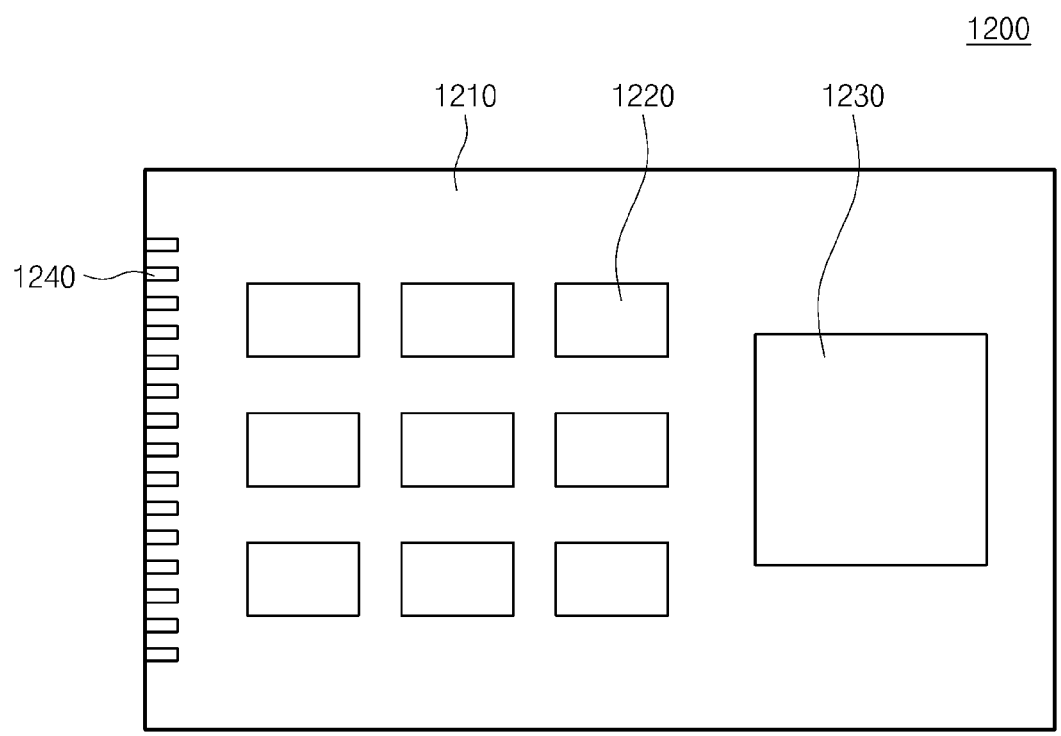
FIG. 4 is a diagram illustrating an example of a package module including a semiconductor package according to embodiments of the inventive concepts.
Figure 5:
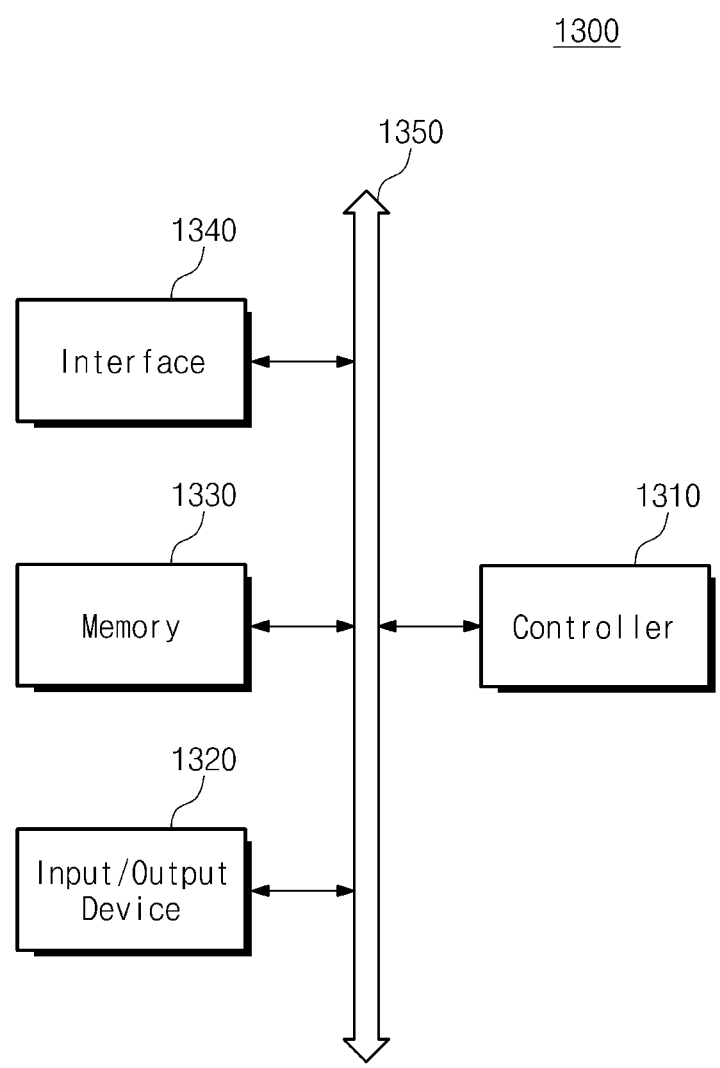
FIG. 5 is a schematic block diagram illustrating an example of an electronic system including a semiconductor package according to embodiments of the inventive concepts.
Figure 6:
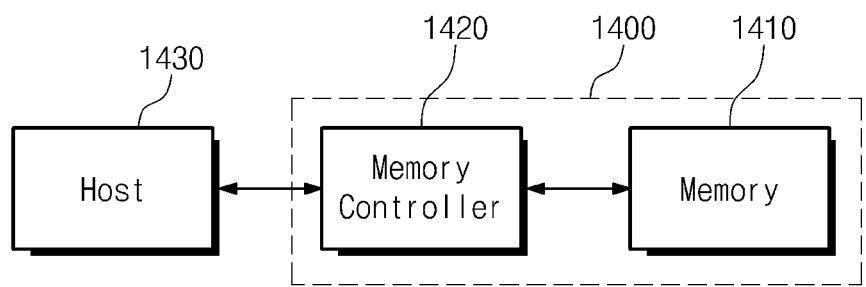
FIG. 6 is a schematic block diagram illustrating an example of a memory card including a semiconductor package according to embodiments of the inventive concepts.

FIG. 4 is a diagram illustrating an example of a package module including a semiconductor package according to embodiments of the inventive concepts. FIG. 5 is a schematic block diagram illustrating an example of an electronic system including a semiconductor package according to embodiments of the inventive concepts. FIG. 6 is a schematic block diagram illustrating an example of a memory card including a semiconductor package according to embodiments of the inventive concepts.

Referring to FIG. 4, a package module 1200 may include one or more first semiconductor device 1220 and a second semiconductor device 1230 packaged using a quad flat package (QFP) technique. The semiconductor devices 1220 and 1230 may include at least one of semiconductor packages 1 to 3 according to embodiments of the inventive concepts. The package module 1200 may be connected to an external electronic device through external connection terminals 1240 provided on a side of a board 1210.

Referring to FIG. 5, an electronic system 1300 may include a controller 1310, an input/output (I/O) device 1320, and a memory device 1330. The controller 1310, the I/O device 1320, and the memory device 1330 may communicate with each other through a data bus 1350. The data bus 1350 may correspond to a path through which electrical signals are transmitted. For example, the controller 1310 may include at least one of a microprocessor, a digital signal processor, a microcontroller, and other logic devices having a similar function to any one thereof. At least one of the controller 1310 and the memory device 1330 may include at least one of the semiconductor packages 1 to 3 according to the aforementioned embodiments of the inventive concept. The I/O device 1320 may include at least one of a keypad, a keyboard, or a display unit. The memory device 1330 is a device storing data. The memory device 1330 may store data and/or commands executed by the controller 1310. The memory device 1330 may include at least one of a volatile memory device and a non-volatile memory device. In some embodiments, the memory device 1330 may include a flash memory device. For example, the flash memory device applied with the technique of the inventive concept may be installed in an information processing system such as a mobile device or a desktop computer. The flash memory device may be realized as solid-state disks (SSD). In this case, the electronic system 1300 may stably store massive data in the memory device 1330. The electronic system 1300 may further include an interface unit 1340 that transmits electrical data to a communication network or receives electrical data from a communication network. The interface unit 1340 may operate by wireless or cable. For example, the interface unit 1340 may include an antenna or a wireless/cable transceiver. Although not shown in the drawings, the electronic system 1300 may further include an application chipset and/or a camera image processor (CIS).

The electronic system 1300 may be realized as a mobile system, a personal computer, an industrial computer, or a multi-functional logic system. For example, the mobile system may be one of a personal digital assistant (PDA), a portable computer, a web tablet, a wireless phone, a mobile phone, a laptop computer, a digital music player, a memory card, or an information transmitting/receiving system. If the electronic system 1300 is an apparatus capable of performing a wireless communication, the electronic device 1300 may be used in a communication interface protocol such as a third generation communication system (e.g., CDMA, GSM, NADC, E-TDMA, WCDMA, CDMA2000).

Referring to FIG. 6, a memory card 1400 may include a non-volatile memory device 1410 and a memory controller 1420. The non-volatile memory device 1410 and the memory controller 1420 may store data or may read stored data. At least one of the memory device 1410 and the memory controller 1420 may include at least one of the semiconductor packages 1 to 3 according to the aforementioned embodiments of the inventive concept. The memory controller 1420 may read data from/store data into the non-volatile memory device 1410 in response to read/write request of a host 1430.

According to embodiments of the inventive concepts, the groove may be formed by the sawing process and may have the edge making the obtuse angle. The first semiconductor chips may be separated from each other by the groove. In addition, the unit mold layers may also be separated from each other by the groove. When the unit mold layers are separated from each other, the adhesive film may be modified. In this case, the package units (i.e., the semiconductor packages) may come in contact with each other. Since the edge of the groove has an obtuse angle, the distance between the first semiconductor chips may be equal to or greater than the distance between the unit mold layers respectively disposed on the first semiconductor chips in the package units adjacent to each other. Thus, the probability of contact between the first semiconductor chips may be reduced and it is possible to prevent the first semiconductor chips from being damaged during the sawing process.

The bottom surface of the first semiconductor chip may make an obtuse angle with the sidewall of the first semiconductor chip. Thus, the first semiconductor chip may be prevented from being damaged by the external impact to improve the reliability of the semiconductor package.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method of fabricating a semiconductor package, the method comprising:
   providing a semiconductor substrate having a top surface on which chip stacks are mounted, each of the chip stacks comprising a plurality of stacked semiconductor chips;
   forming a mold layer covering the chip stacks on the top surface of the semiconductor substrate; and
   forming a groove penetrating the semiconductor substrate and the mold layer by performing a sawing process on a bottom surface of the semiconductor substrate,
   wherein the groove comprises:
   first sidewalls adjacent to the top surface of the semiconductor substrate and extending in a direction inclined with respect to the bottom surface of the semiconductor substrate;
   second sidewalls connected to the first sidewalls and extending in a direction substantially perpendicular to the bottom surface of the semiconductor substrate; and
   edges formed at a location the first sidewalls meet the second sidewalls,
   wherein the edges are formed in the mold layer.

2. The method of claim 1, wherein a maximum width of the groove formed in the semiconductor substrate is greater than a maximum width of the groove formed in the mold layer.

3. The method of claim 1, wherein forming the groove comprises:
   sawing the semiconductor substrate from the bottom surface of the semiconductor substrate toward the mold layer to form a first groove having the first sidewalls, the mold layer being exposed along the first sidewalls of the first groove; and
   sawing the mold layer exposed by the first groove to form a second groove having the second sidewalls.

4. The method of claim 1, wherein the first sidewall makes an obtuse angle with the bottom surface of the semiconductor substrate.

5. The method of claim 1, wherein the semiconductor substrate includes base semiconductor chips having through-vias penetrating the base semiconductor chips, and
   wherein each of the chip stacks are electrically connected to a corresponding base semiconductor chip.

6. The method of claim 5, wherein the semiconductor substrate is divided into the base semiconductor chips by the groove and the mold layer is divided into unit mold layers by the groove, and
   wherein a distance between a pair of adjacent base semiconductor chips is greater than a distance between a pair of adjacent unit mold layers.

7. The method of claim 1, wherein active surfaces of the semiconductor chips of the chip stacks face the semiconductor substrate.

8. The method of claim 1, wherein the groove penetrates the mold layer disposed between a pair of adjacent chip stacks.

9. The method of claim 1, wherein the semiconductor substrate comprises: a passivation layer covering the bottom surface; and external terminals formed on the bottom surface, and wherein the passivation layer is exposed.

10. A method of fabricating a semiconductor package, the method comprising:

preparing a semiconductor substrate including first semiconductor chips;

mounting second semiconductor chips on a top surface of the semiconductor substrate;

forming a mold layer covering the second semiconductor chips on the top surface of the semiconductor substrate; and forming a groove penetrating the semiconductor substrate and the mold layer to separate the first semiconductor chips from each other, wherein forming the groove comprises:

performing a first sawing process on a bottom surface of the semiconductor substrate to cut the semiconductor substrate and a portion of the mold layer in a direction inclined with respect to the bottom surface of the semiconductor substrate; and performing a second sawing process to cut the mold layer in a direction substantially perpendicular to the bottom surface of the semiconductor substrate, wherein a minimum width of the groove formed in the semiconductor substrate by the first sawing process is greater than a width of the groove formed in the mold layer by the second sawing process.

11. The method of claim 10, wherein the second sawing process is performed to be spaced apart from the semiconductor substrate.

12. The method of claim 10, wherein the groove formed by the first sawing process has inclined sidewalls, and wherein the semiconductor substrate and the mold layer are exposed along the inclined sidewalls.

13. The method of claim 10, wherein the first semiconductor chip comprises:

a first integrated circuit layer;

a passivation layer covering the first integrated circuit layer;

a first through-via penetrating the first semiconductor chip and connected to the first integrated circuit layer; and an external terminal electrically connected to the first integrated circuit layer, wherein the passivation layer is exposed.

14. The method of claim 10, further comprising:

mounting third semiconductor chips on the second semiconductor chips, wherein each of the second semiconductor chips has a through-via penetrating the corresponding second semiconductor chip.

15. The method of claim 10, wherein the semiconductor substrate is divided into the first semiconductor chips by the first sawing process, wherein the mold layer is divided into unit mold layers by the second sawing process, and a minimum distance between a pair of adjacent first semiconductor chips is greater than a minimum distance between a pair of adjacent unit mold layers respectively disposed on the first semiconductor chips adjacent to each other.

16. A method of fabricating a semiconductor package, the method comprising:

providing a semiconductor substrate having a top surface on which chip stacks are mounted, each of the chip stacks comprising a plurality of stacked semiconductor chips;

forming a mold layer covering the chip stacks on the top surface of the semiconductor substrate; and forming a first groove penetrating the semiconductor substrate, the first groove having first sidewalls inclined with respect to a bottom surface of the semiconductor substrate; and forming a second groove penetrating the mold layer extending in a direction substantially perpendicular to the bottom surface of the semiconductor substrate to form package units separated from each other, wherein the second groove comprise second sidewalls connected to the first sidewalls, the second groove exposed through the first groove.

17. The method of claim 16, wherein edges are formed at a location where the first sidewalls meet the second sidewalls, and wherein the edges are formed in the mold layer.

18. The method of claim 16, wherein edges are formed at a location where the first sidewalls meet the second sidewalls, and wherein the edges are formed on sidewalls of the semiconductor chips.

19. The method of claim 16, wherein forming the first groove comprises performing a sawing process using a blade having a substantially V-shaped cross-section on the bottom surface of the semiconductor substrate toward the mold layer to form the first groove, wherein forming the second groove comprises performing another sawing process on the mold layer exposed through the first groove using a second blade having a substantially rectangular cross-section.

20. The method of claim 16, wherein a width of the second groove formed in the mold layer is smaller than a width of the first groove at the bottom surface of the semiconductor substrate, and wherein the width of the second groove formed in the mold layer is substantially equal to a width of the first groove at the top surface of the semiconductor substrate.

* * * * *